United States Patent [19]

Sato et al.

[11] Patent Number: 5,577,076
[45] Date of Patent: Nov. 19, 1996

[54] SCANNING RECEIVER FOR RECEIVING A SIGNAL BY SCANNING FREQUENCY OF RECEIVED SIGNAL

[75] Inventors: Kazunori Sato; Hironori Warabi; Yasuyoshi Nakano; Kenji Yamazaki, all of Ichikawa, Japan

[73] Assignee: Uniden Corporation, Chiba, Japan

[21] Appl. No.: 407,215

[22] Filed: Mar. 20, 1995

Related U.S. Application Data

[63] Continuation-in-part of Ser. No. 180,225, Jan. 11, 1994, abandoned.

[30] Foreign Application Priority Data

Jul. 27, 1993 [JP] Japan .................. 5-184641

[51] Int. Cl.$^6$ .............. H04B 1/00; H03D 1/04; H03K 5/01
[52] U.S. Cl. ............ 375/346; 375/316; 455/161.2; 455/165.1
[58] Field of Search ................... 375/340, 316, 375/324, 346, 350, 351, 285, 319; 455/161.1, 161.2, 161.3, 165.1, 166.1, 166.2; 324/72.26, 72.27

[56] References Cited

U.S. PATENT DOCUMENTS

| 4,947,456 | 8/1990 | Atkinson et al. | 455/165.1 |
| 5,014,348 | 5/1991 | Boone et al. | 455/165.1 |
| 5,195,109 | 3/1993 | Bochmann et al. | 455/161.1 X |
| 5,200,682 | 6/1993 | Tomohiro | 455/161.2 |
| 5,428,826 | 6/1995 | Masaki | 405/161.2 |

FOREIGN PATENT DOCUMENTS 3-187622  8/1991  Japan .

*Primary Examiner*—Young T. Tse
*Assistant Examiner*—Bryan E. Webster
*Attorney, Agent, or Firm*—Ratner & Prestia

[57] ABSTRACT

In a scanning receiver for receiving a signal by scanning the frequency of a received signal, the speed of a scanning operation is made fast with skipping non-modulated signals and digital signals. AF signal is changed into A/D converted values, and first and second amplitude distribution are respectively formed from A/D converted values. Non-modulated signal is discriminated based on the first amplitude distribution, and digital signal is discriminated based on the second amplitude distribution.

5 Claims, 23 Drawing Sheets

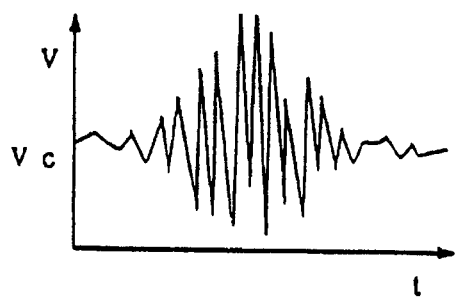
FIG. 2A AUDIO SIGNAL WAVEFORM
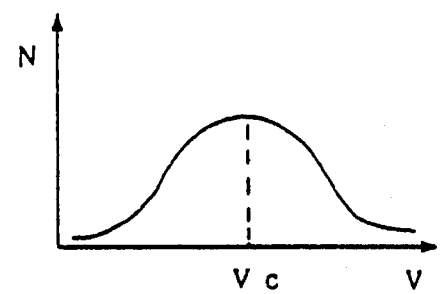
FIG. 2D AMPLITUDE DISTRIBUTION OF AUDIO SIGNAL
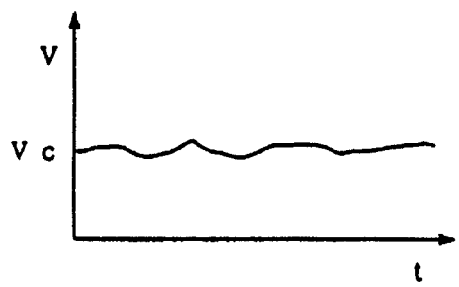
FIG. 2B NON-MODULATED SIGNAL WAVEFORM
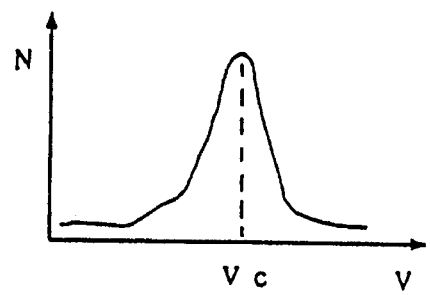
FIG. 2E AMPLITUDE DISTRIBUTION OF NON-MODULATED SIGNAL
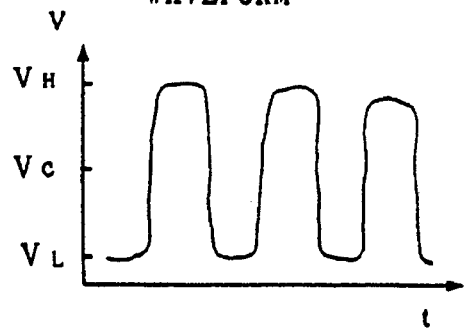
FIG. 2C DIGITAL SIGNAL WAVEFORM
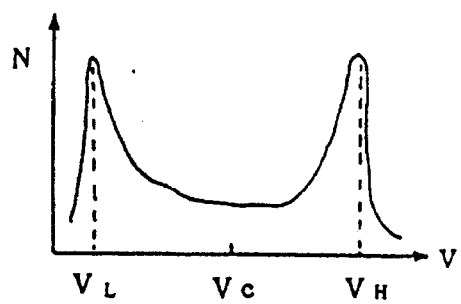
FIG. 2F AMPLITUDE DISTRIBUTION OF DIGITAL SIGNAL

SCANNING RECEIVER FOR RECEIVING A SIGNAL BY SCANNING FREQUENCY OF RECEIVED SIGNAL

This application is a continuation in part of application Ser. No. 08/180,225, filed Jan. 11, 1994, abandoned.

BACKGROUND OF THE INVENTION

1. Field of the Invention

The present invention relates to a scanning receiver for receiving a signal by scanning the frequency of a received signal, more particularly to a scanning receiver having a high speed scanning operation. The present invention further relates to a scanning method for scanning the frequency of a received signal in the scanning receiver.

2. Description of the Prior Art

FIG. 1 schematically represents an arrangement of a conventional scanning receiver. In this receiver, a signal received via an antenna 1 by an RF (radio frequency) circuit 2, is mixed with an oscillating frequency signal supplied from a frequency synthesizer (now shown.) in the RF circuit 2, and then converted into an intermediate frequency signal. The frequency synthesizer includes a PLL (phase-looked loop) circuit. Upon supply of reception frequency data from a microprocessor 4, the PLL circuit is locked up, so that this frequency synthesizer produces the oscillating frequency signal having a predetermined oscillating frequency. The intermediate frequency signal is supplied to an IF (intermediate frequency) circuit 6. A noise detecting circuit 8 detects noises contained in the intermediate frequency signal and changes the level of noise into a DC (direct current) voltage. When the resulting DC voltage obtained after the noise detecting is lower than a threshold value, the noise detecting circuit 8 knows that an audio signal has been received and generates an SC (Scan Control) signal. The SC signal is then supplied to the microprocessor 4. The microprocessor 4 interrupts the scanning operation, and the intermediate frequency signal derived from the IF circuit 6 is supplied to an AF (audio frequency) circuit 10. In the AF circuit 10, the intermediate frequency signal is converted into an AF signal by a frequency discriminator (now shown) and then is supplied to a speaker 11.

As described above, in the conventional scanning receiver, when the SC signal is generated in the noise detecting circuit 8, the scanning operation is interrupted or stopped. As a result, even when unwanted signals such as non-modulated signals and digital signals are received, the SC signal is generated in the noise detecting circuit 8 so that the scanning operation in the microprocessor 4 is stopped. This means that no discrimination can be established between audio signals and said unwanted signals. Under such circumstances, there is a problem that even when either a non-modulated signal or a digital signal is received, such unwanted signal may be erroneously recognized as an audio signal, thereby interrupting the scanning operation. This annoys users for the scanning receiver and makes the speed of a scanning operation low.

SUMMARY OF THE INVENTION

An object of the present invention is to provide a method for scanning the frequency of received signals at high speed with skipping non-modulated signals and digital signals, and restarting automatically the scanning operation.

Another object of the present invention is to provide a scanning receiver for scanning the frequency of received signals at high speed with skipping non-modulated signals and digital signals when these signals have been received.

In accordance with one aspect of the present invention, a scanning receiver for receiving a signal by scanning the frequency of a received signal, comprising:

means for sampling and A/D (analog to digital) converting an audio frequency (AF) signal detected by the scanning receiver to produce A/D converted values;

means for forming, from the A/D-converted values, first amplitude distribution every one cycle of predetermined number of samplings;

means for forming, from the A/D-converted values, second amplitude distribution said every one cycle;

means for judging whether or not the part of the AF signal corresponding to one cycle of samplings is a non-modulated signal based on the first amplitude distribution, and generating first judged result every one cycle of samplings;

means for judging whether or not the part of the AF signal corresponding to one cycle of samplings is a digital signal based on the second amplitude distribution, and generating second judged result every one cycle of samplings;

means for discriminating whether or not the received signal is a non-modulated signal based on first amplitude distribution data consisting of the first judged results for predetermined plurality of cycles of samplings;

means for discriminating whether or not the received signal is a digital signal based on second amplitude distribution data consisting of the second judged results for predetermined plurality of the cycles; and means for skipping non-modulated signals and/or digital signals in a scanning operation of the receiver, when the received signal is discriminated as a non-modulated signal and/or a digital signal.

In accordance with another aspect of the present invention, a scanning receiver for receiving a signal by scanning the frequency of a received signal, comprising:

means for sampling and A/D (analog to digital) converting an audio frequency (AF) signal detected by the scanning receiver to produce A/D converted values;

means for forming, from the A/D-converted values, first amplitude distribution every one cycle of predetermined number of samplings;

means for forming, from the A/D-converted values, second amplitude distribution said every one cycle;

means for forming, from the A/D-converted values, third amplitude distribution said every one cycle;

means for judging whether or not the part of the AF signal corresponding to one cycle of samplings is a non-modulated signal based on the first amplitude distribution, and generating first judged result every one cycle of samplings;

means for judging whether or not the part of the AF signal corresponding to one cycle of samplings is a digital signal based on the second amplitude distribution, and generating second judged result every one cycle of samplings;

means for judging whether or not the part of the AF signal corresponding to one cycle of samplings is a digital signal based on the third amplitude distribution, and generating third judged result every one cycle of samplings;

means for discriminating whether or not the received signal is a non-modulated signal based on first amplitude distribution data consisting of the first judged results for predetermined plurality of cycles of samplings;

means for discriminating whether or not the received signal is a digital signal based on second amplitude distribution data consisting of the second judged results for predetermined plurality of the cycles;

means for discriminating whether or not the received signal is a digital signal based on third amplitude distribution data consisting of the second judged results for predetermined plurality of the cycles; and means for skipping non-modulated signals and/or digital signals in a scanning operation of the receiver, when the received signal is discriminated as a non-modulated signal and/or a digital signal.

BRIEF DESCRIPTION OF THE DRAWINGS

For a better understanding of the present invention, reference is made of the following detailed description in conjunction with the accompanying drawings, in which:

FIG. 2A shows an audio signal waveform;

FIG. 2B represents a non-modulated signal waveform;

FIG. 2C indicates a digital signal waveform;

FIG. 2D is a graphic representation of an amplitude distribution of an audio signal;

FIG. 2E is a graphic representation of an amplitude distribution of a non-modulated signal;

FIG. 2F is a graphic representation of an amplitude distribution of a digital signal;

DESCRIPTION OF THE EXEMPLARY EMBODIMENTS

It should be apparent that an audio signal, a non-modulated signal, and a digital signal each owns a specific amplitude distribution thereof. In FIGS. 2A, 2B and 2C, there are shown waveform examples of received signals about an audio signal, a non-modulated signal, and a digital signal. In FIG. 2D, 2E and 2F, there are indicated amplitude distribution patterns of these different signals. With respect to the signal waveforms, an abscissa indicates time lapse (t) and an ordinate shows an amplitude value in voltage (V). With regard to the amplitude distribution patterns, an abscissa represents an amplitude value in voltage (V) and an ordinate shows an amplitude distribution (N).

As apparent from FIGS. 2A and 2D, in case of an audio signal, the amplitude distribution pattern thereof represents a gentle curve with a peak corresponding to an offset voltage (a center voltage) "Vc" of the audio signal. Also, as obvious from FIGS. 2B and 2E, with respect to a non-modulated signal, the amplitude distribution pattern thereof represents a steep curve with a peak corresponding to an offset voltage "Vc" of the non-modulated signal. Further, as easily seen from FIGS. 2C and 2F, in case of a digital signal, the amplitude distribution pattern owns such a curve with the first peak corresponding to the minimum amplitude value $V_L$ of the digital signal and the second peak corresponding to the maximum amplitude value $V_H$ thereof.

As described above, since the amplitude distribution patterns of these audio signal, non-modulated signal, and digital signal are different from each other, received signals may be discriminated by investigating features of the amplitude distribution patterns. It should be noted that only a non-modulated signal and a digital signal are discriminated in the actual operation, and signals other than a non-modulated signal and a digital signal are handled as audio signals. The reason thereof is that the object of the present invention is to make the resultant scanning operation fast by skipping received non-modulating signals and digital signals in the scanning operation of the receiver.

Figure 1:
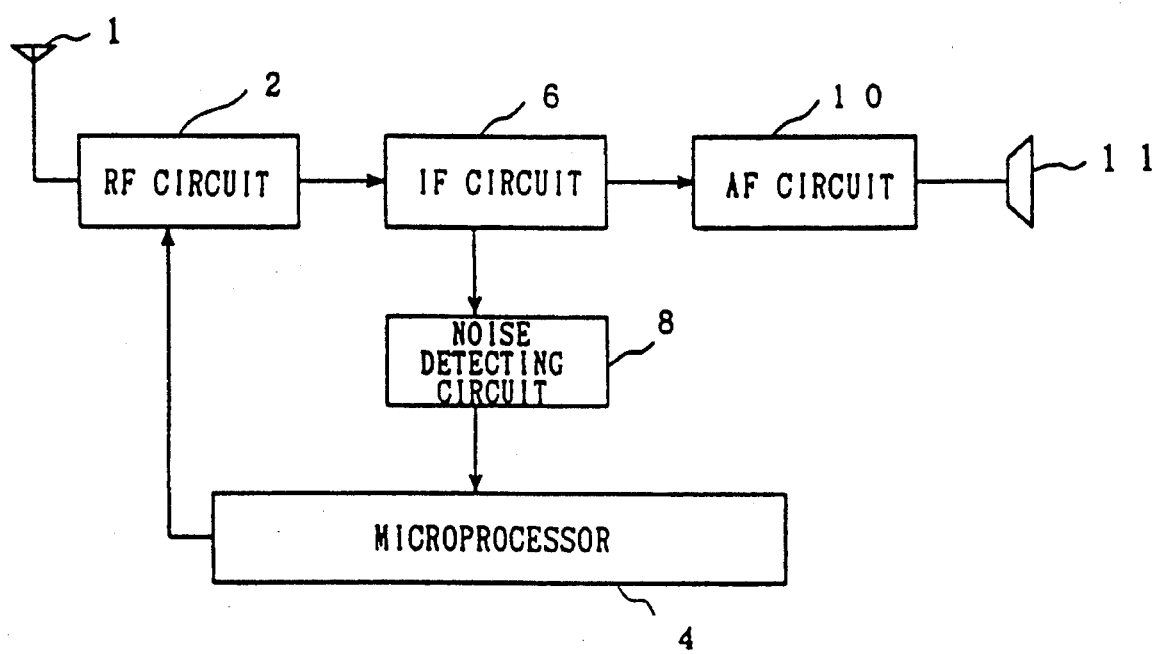
FIG. 1 schematically shows an arrangement of a conventional scanning receiver.
Figure 3:
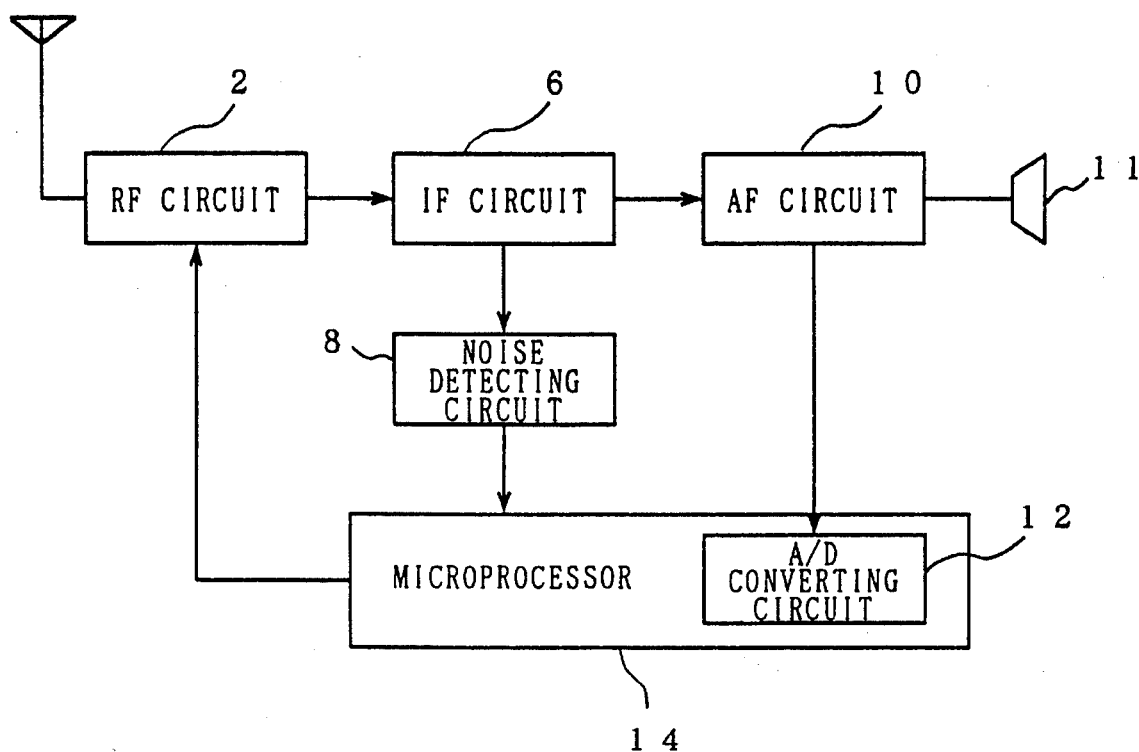
FIG. 3 schematically indicates an arrangement of a scanning receiver to which the present invention has been applied.

FIG. 3 is a schematic block diagram for indicating an overall arrangement of a scanning receiver to which the present invention is applied. This circuit arrangement comprises a microprocessor 14 which includes an A/D (analog to digital) converting circuit 12. This A/D converting circuit 12 converts amplitude values of an AF signal from the AF circuit 10 into digital values. Since the remaining circuits are the same as those of the conventional scanning receiver indicated in FIG. 1, the same reference numerals are employed as those for denoting them.

In FIG. 3, the AF (audio frequency) signal derived form the AF circuit 10 is supplied to the A/D converting circuit 12 in the microprocessor 14. The amplitude values of the AF signal are sampled at a 10 ms sampling interval and converted into digital values (referred to as A/D converted values hereinafter) in the A/D converting circuit 12.

In the microprocessor 14, amplitude distribution data for discriminating whether the received signal is a non-modulated signal, a digital signal or an audio signal are produced from the A/D converted values, and the scanning operation is controlled based on that signal discrimination. The amplitude distribution data will be explained in more detail later.

Figure 4:
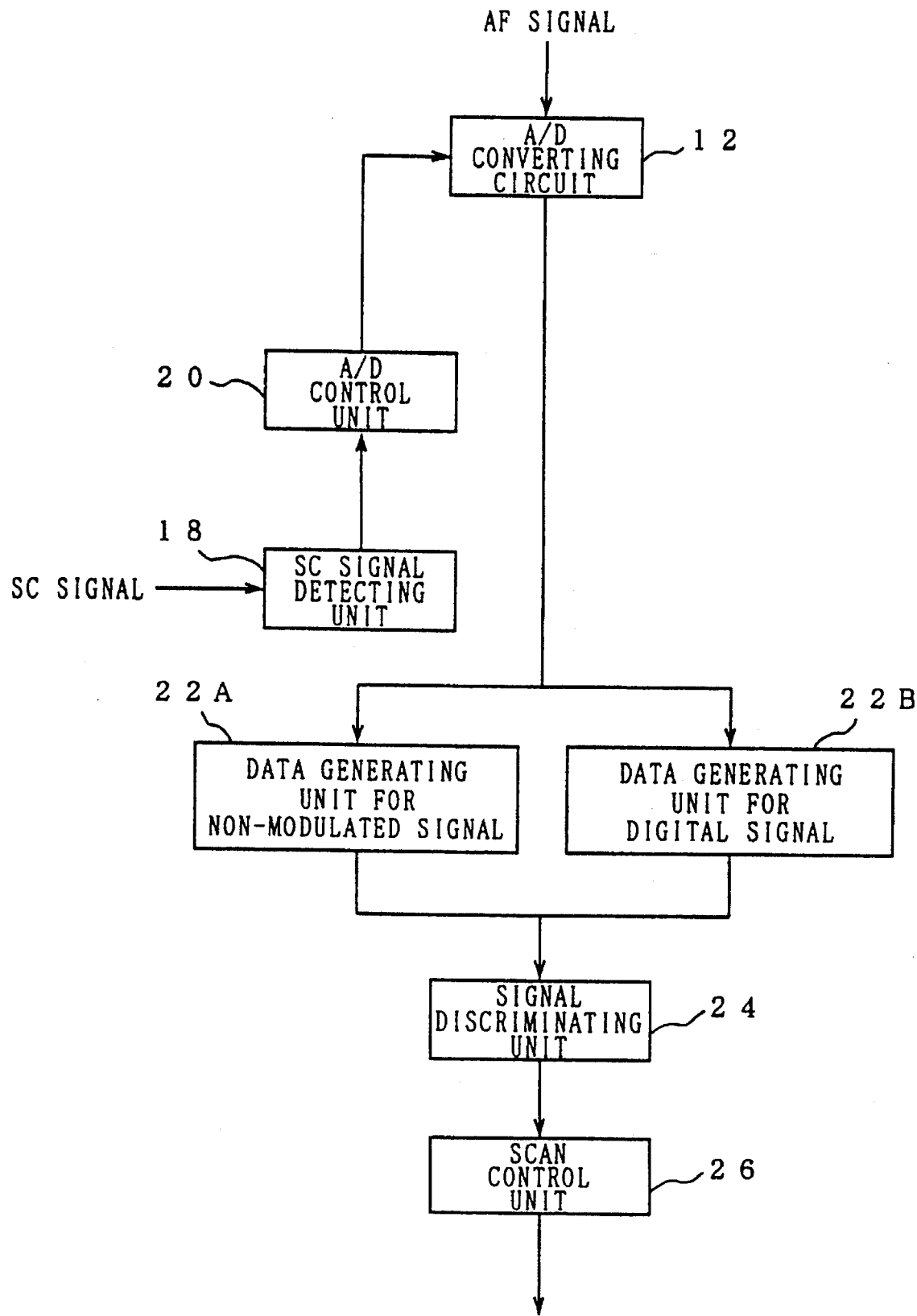
FIG. 4 is a functional block diagram of a micro processor.

FIG. 4 is a functional block diagram for explaining various functions of the microprocessor 14. The microprocessor 14 includes, other than the A/D converting circuit 12, a SC signal detecting unit 18 for detecting the SC signal from the noise detecting circuit 8, a control unit 20 for controlling the A/D converting circuit 12, an amplitude distribution data generating unit 22A for discriminating a non-modulated signal, and an amplitude distribution data generating unit 22B for discriminating a digital signal. The microprocessor 14 further includes a signal discriminating unit 24 for discriminating whether the received signal is an audio signal, a non-modulated signal, or a digital signal based on the amplitude distribution data from the units 22A and 22B, and a scan control unit 26 for controlling the scanning operation based on the discrimination result of the received signal in the signal discriminating unit 24.

Figure 5:
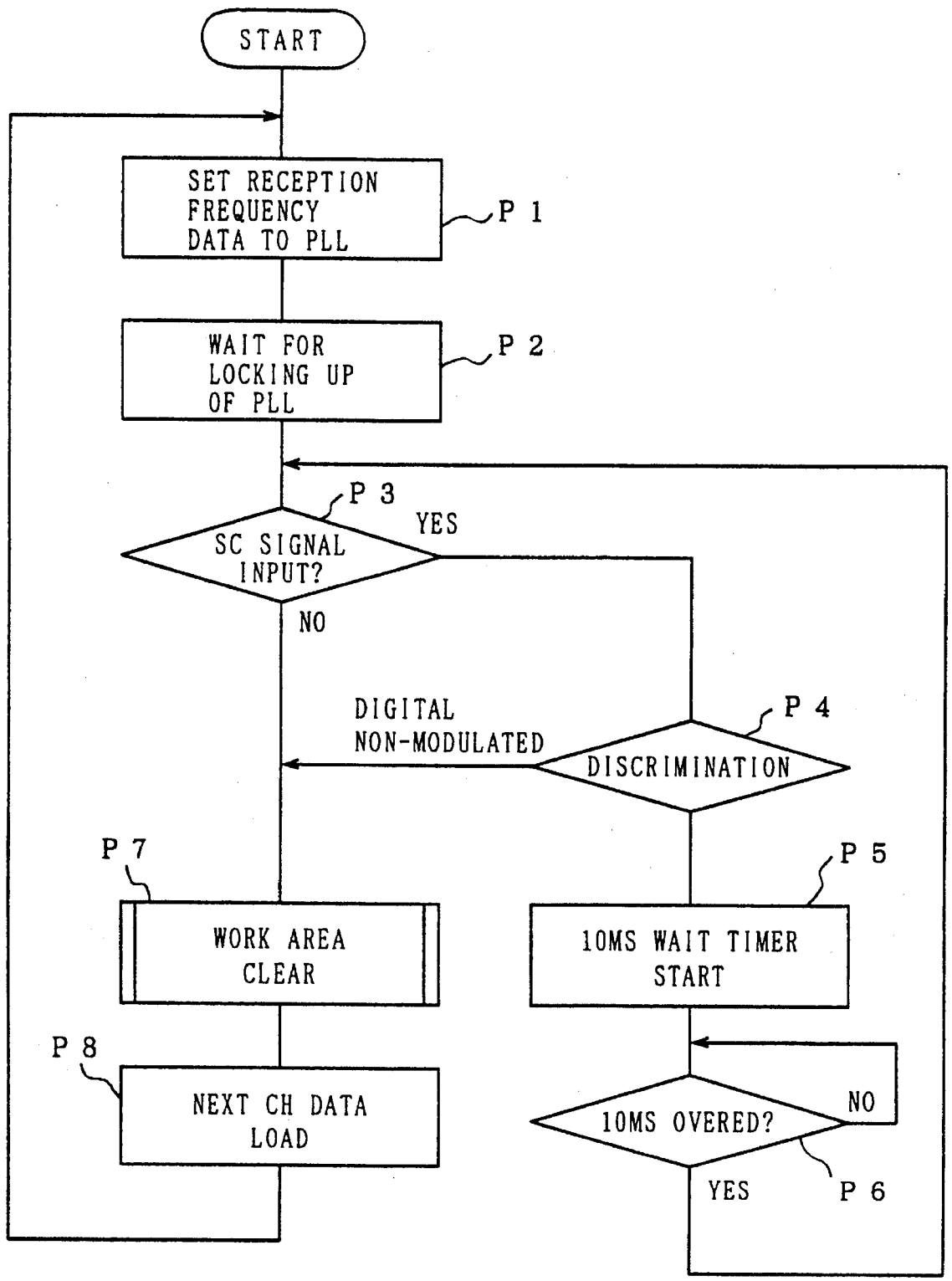
FIG. 5 is a flow chart for showing a process operation of the microprocessor.

The operation of the scanning receiver in FIG. 3 will now be explained. FIG. 5 shows a main flow chart for illustrating a process operation of the microprocessor 14. The scan control unit 26 in the microprocessor 14 loads the first channel data (CH DATA) from a memory (not shown) to set reception frequency data to the PLL circuit of the frequency synthesizer in the RF circuit 2 (step P1), and then waits for the locking up of the PLL circuit (step P2).

After the PLL circuit has been locked up, the SC signal detecting unit 18 judges whether or not the SC signal is input from the noise detecting circuit 8 (step P3). If the SC signal is input, the process operation is advanced to the step P4 for discriminating the received signal.

In the discrimination step P4, as is explained later, it is finally discriminated in the signal discriminating unit 24 whether the received signal is any of an audio signal, a non-modulated signal and a digital signal. The presence of the SC signal is checked every 10 ms. For this purpose, a 10 ms wait timer is started (step P5), and if 10 ms have been overed, then the process operation is returned to the step P3.

If the received signal is finally discriminated as a non-modulated signal or a digital signal, or if the SC signal is not input in the step P3, then a work area for discrimination is cleared (step P7). Subsequently, the scan control unit 26 loads next channel data from the memory (step P8) to set next reception frequency data to the PLL circuit so that the scanning operation for the subsequent frequency is restarted.

Figure 6:
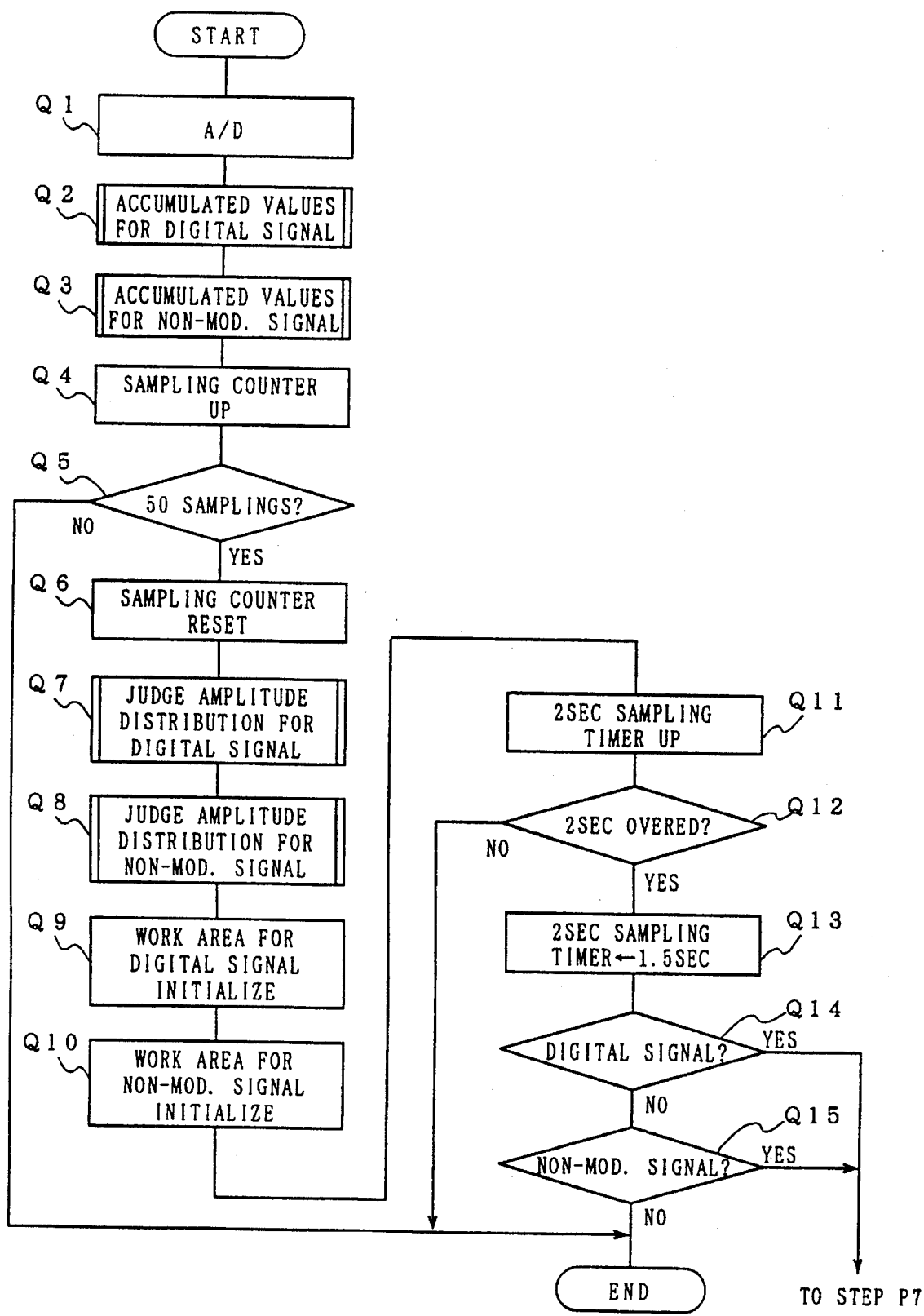
FIG. 6 is a detailed flow chart of the step P4 in FIG. 5.

FIG. 6 shows a detailed flow chart of the discriminating step P4 in FIG. 5. In FIG. 6, when the SC signal detecting unit 18 detects the SC signal from the noise detecting circuit 8, the unit 18 instructs the control unit 20 so that the A/D converting circuit 12 samples the AF signal from the AF circuit 10 every sampling interval of 10 ms to convert the amplitude values of the AF signal into A/D converted values (step Q1). The resulting A/D converted values are supplied to the amplitude distribution data generating units 22A and 22B respectively.

In the amplitude distribution data generating unit 22B for discriminating a digital signal, if an A/D converted value obtained by one sampling in the circuit 12 is included in any of consecutive four amplitude distribution levels for judging a digital signal, each level having a predetermined voltage range, the number of the A/D converted values included in each level is accumulated respectively to produce accumulated values (step Q2).

Subsequently, in the amplitude distribution data generating unit 22A for discriminating a non-modulated signal, if an A/D converted value obtained by one sampling in the circuit 12 is included in any of consecutive four amplitude distribution levels for judging a non-modulated signal, each level having a predetermined voltage range, the number of the A/D converted values included in each level is accumulated respectively to produce accumulated values (step Q3).

When the process for one sampling is completed, a sampling counter for counting the number of samplings in the A/D converting circuit 12 is counts up (step Q4), and then it is judged whether or not the counted value in the sampling counter equals to 50, i.e., whether or not samplings have been carried out 50 times (step Q5). If samplings have not been carried out 50 times, then the process operation is returned to the step P3 via the steps P5 and P6 in FIG. 5. If samplings have been carried out 50 times, then the sampling counter is reset (step Q6).

According to the above described process operation, final accumulated values in respective amplitude distribution levels for judging a digital signal and a non-modulated signal are obtained every 50 samplings. The final accumulated values for judging a digital signal are stored in a work area for judging a digital signal, and the final accumulated values for judging a non-modulated signal are stored in a work area for judging a non-modulated signal.

Using these stored final accumulated values in respective amplitude distribution levels, it is possible to judge an amplitude distribution pattern of the part of the AF signal corresponding to the time duration in which 50 samplings are carried out (i.e., 10 ms×50=0.5 s). That is, in the amplitude distribution data generating unit 22B, it is judged whether or not the part of the AF signal has a digital amplitude distribution pattern, and the judged result is stored in a judged result storing area (step Q7). In the amplitude distribution data generating unit 22A, also, it is judged whether or not AF signal has a non-modulated signal amplitude distribution pattern. If the AF signal has a non-modulated signal amplitude distribution pattern, then a judged result counter is counted up.

After the judging processes in the steps Q7 and Q8 have been terminated, the work areas for judging a digital signal and a non-modulated signal respectively are initialized (step Q9 and Q10).

When 50 samplings have been carried out, a 2-sec sampling timer is upped by 10 ms×50=0.5 sec (step Q11). Then, it is judged whether or not 2 sec has been overed (step Q12). The time lapse of 2 sec shows that 4 cycles of 50 samplings have been carried out. If 2 sec has been overed, then the count starting time of the timer is changed to 1.5 sec (step Q13). The reason thereof is that the subsequent counting for 4 cycles uses the last consecutive 3 cycles. If 2 sec has not been overed in the timer, then the process operation is retruded to the step P3 via the steps P5 and P6 in FIG. 5.

According to the above described steps Q7–Q13, it is judged whether the part of AF signal on each cycle of last consecutive 4 cycles is a digital signal or a non-modulated signal. It should be noted that the judged results for last consecutive 4 cycles in the units 22B and 22a are referred to as amplitude distribution data for discriminating a digital signal and amplitude distribution data for discriminating a non-modulated signal, respectively.

In the signal discriminating unit 24, if the amplitude distribution data from the unit 22B shows that the parts of AF signal on two or more cycles in last consecutive four cycles are digital signals, then the received signal is finally discriminated as a digital signal (step Q14). Also, in the signal discriminating unit 24, if the amplitude distribution data from the unit 22A show that the parts of the AF signals on all four last consecutive cycles are non-modulated signals, then the received signal is finally discriminated as a non-modulated signal (step Q15). If the received signal is discriminated as a digital signal or a non-modulated signal, then the process operation proceeds to the step P7 in Fig.5, wherein the work area for discrimination is cleared.

Figure 7:
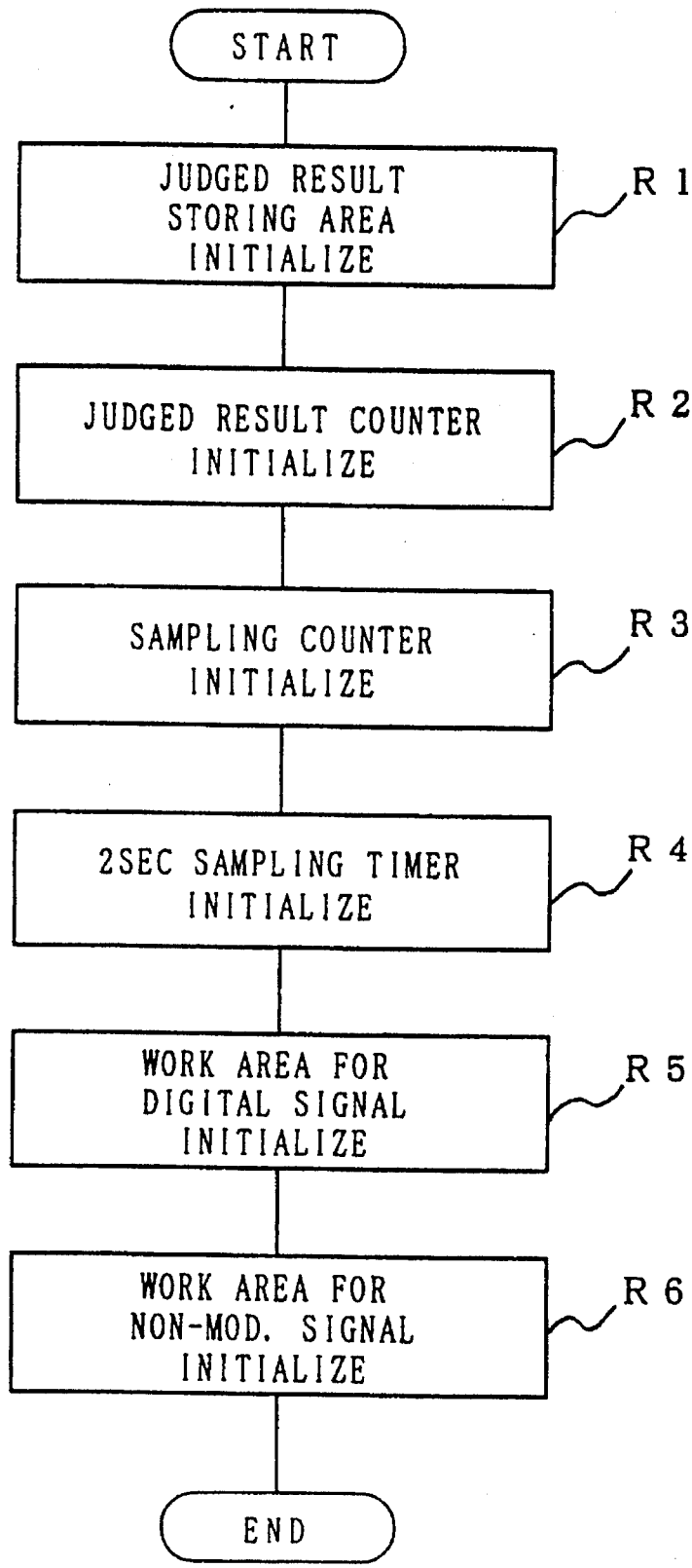
FIG. 7 is a detailed flow chart of the step P7 in FIG. 5.

FIG. 7 shows a detailed flow of the step P7. The clearing for the work area includes the steps of; initializing the judged result storing area described in the step Q7 (step R1), initializing the judged result counter described in the step Q8 (step R2), initializing the sampling counter described in the step Q4 (step R3), initializing the 2-sec sampling timer described in the step Q11 (step R4), initializing the work area for judging a digital signal described in the step Q7 (step R5), and initializing the work area for judging a non-modulated signal described in the step Q8 (step R6).

Figure 8:
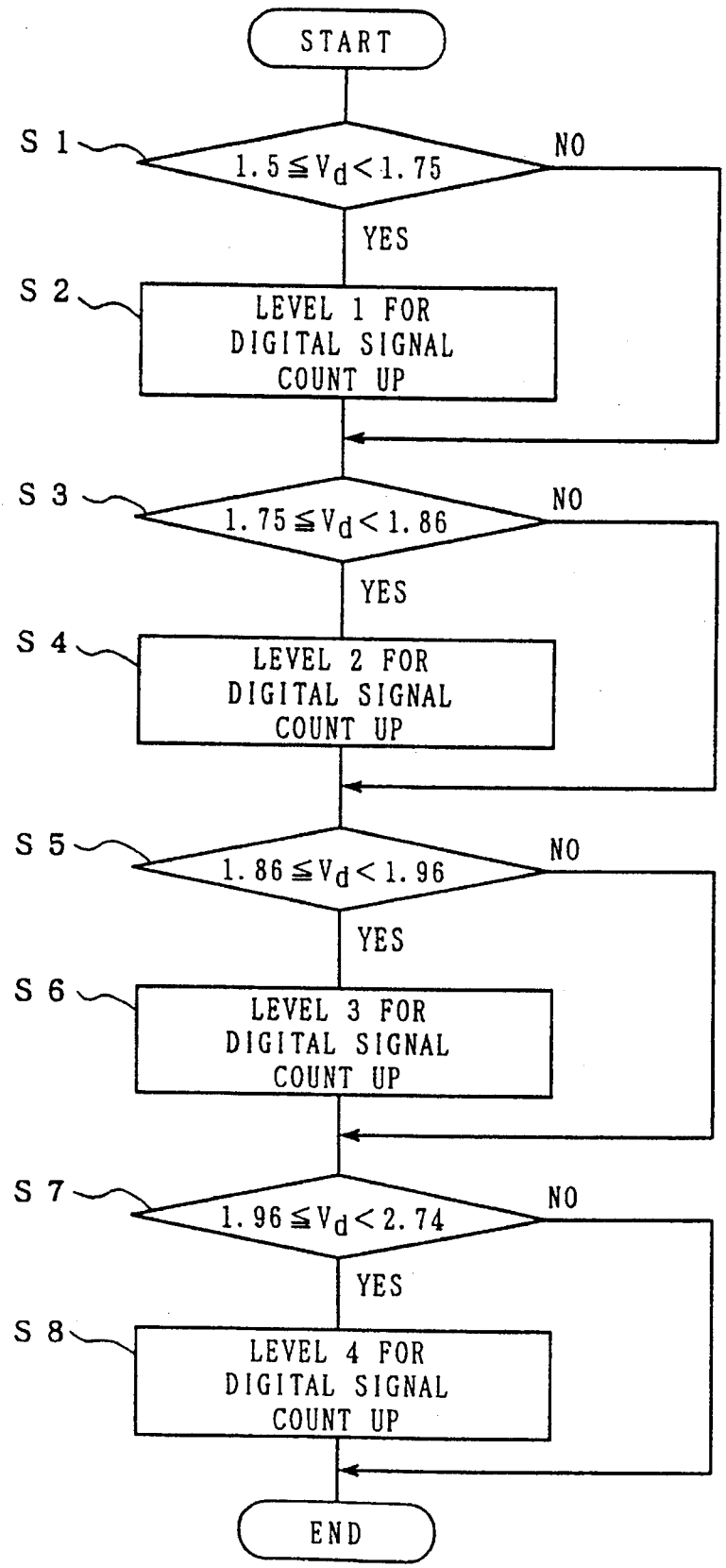
FIG. 8 is a detailed flow chart of the step Q2 in FIG. 6.

The process operation in the step Q2 in FIG. 6 will be now explained in more detail with reference to FIG. 8. As described before in the step Q2, if an A/D converted value obtained by one sampling in the circuit 12 is included in any of consecutive four amplitude distribution levels 1, 2, 3 and 4 for judging a digital signal, each level having a predetermined voltage range, the number of the A/D converted values included in each level is accumulated respectively to produce accumulated values.

Assuming that the value of an A/D converted value is Vd, if $1.50\ V \leq Vd < 1.75\ V$ (step S1), then a counter for an amplitude distribution level 1 is counted up (step S2). If $1.75\ V \leq Vd < 1.86\ V$ (step S3), then a counter for an amplitude distribution level 2 is counted up (step S4). If $1.86\ V \leq Vd < 1.96\ V$ (step S5), then a counter for an amplitude distribution level 3 is counted up (step S6). If $1.96\ V \leq Vd < 2.74\ V$ (step S7), then a counter for an amplitude distribution level 4 is counted up (step S8). As a result, accumulated values for judging a digital signal are obtained.

Figure 9:
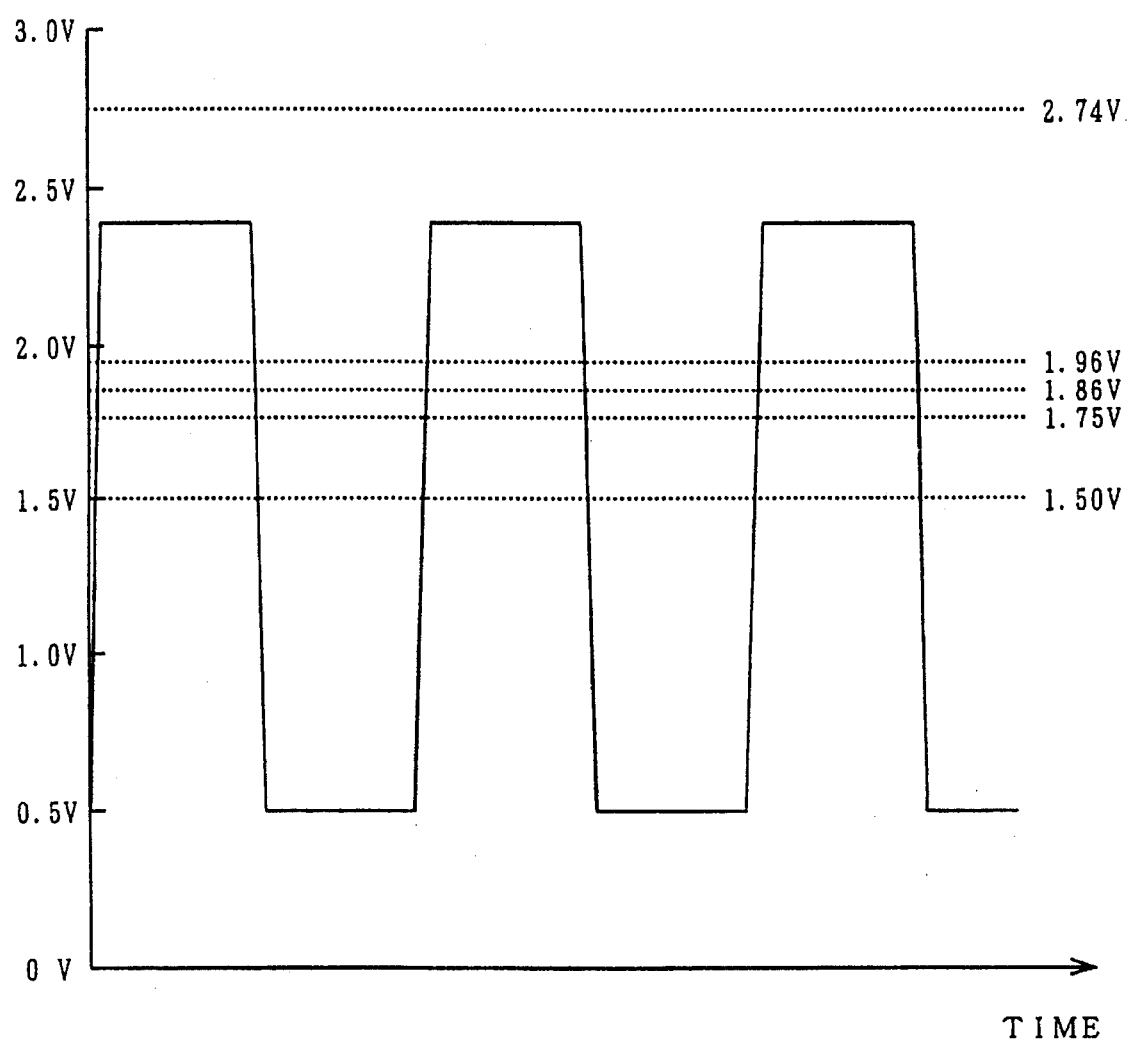
FIG. 9 is a waveform of a FSK signal.

The reason why such voltage ranges are selected for amplitude distribution levels for judging a digital signal will now be described. One example of a digital signal is a FSK (frequency-shift keying) signal having a frequency shift of ±4.5 kHz in a POCSAG paging system. In FIG. 9, there is shown the wave form of the FSK signal which is supplied to the A/D converting circuit 12. As shown in FIG. 9, the FSK signal has a duty factor of about 0.5 and has amplitude values ranging between about 2.4 V and 0.5 V.

It is apparent that the amplitude distribution is concentrated into about 2.4 V and 0.5 V in such FSK signal as already have explained with reference to FIG. 2F. Since the duty factor of the FSK signal is about 0.5, the amplitude distribution pattern thereof has two peaks whose values are substantially the same. Therefore, the feature of the amplitude distribution pattern may be recognized by detecting any one of two peaks. Therefore, the voltage range for the amplitude distribution level 4 is selected between 1.96 V and 2.74 V so as to detect the peak corresponding to about 2.4 V. The voltage range is selected so widely, because the deviation of characteristic of the frequency discriminator in the AF circuit 10 and the deviation of transmitted shift frequency have been considered. The voltage range of the level 4 is selected so broadly that the voltage ranges of the levels 2 and 3 become narrower such as 1.75 V–1.86 V and 1.86 V–1.96 V, respectively.

Figure 10:
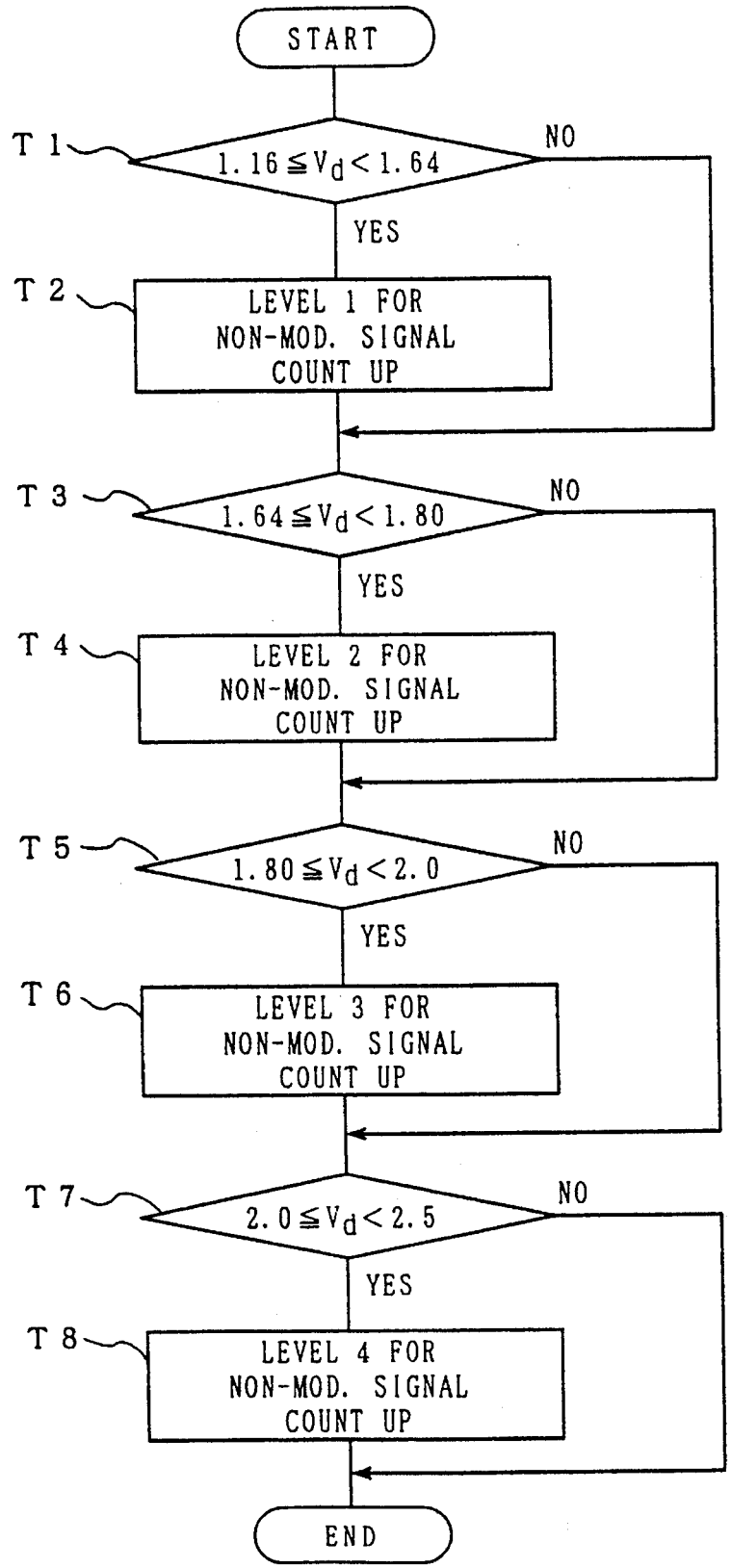
FIG. 10 is a detailed flow chart of the step Q3 in FIG. 6.

The process operation in the step Q3 in FIG. 6 will be now explained in more detail with reference to FIG. 10. As described before in the step Q3, if an A/D converted value obtained by one sampling in the circuit 12 is included in any of consecutive four amplitude distribution levels 1, 2, 3 and 4 for judging a non-modulated signal, each level having a predetermined voltage range, the number of the A/D converted values included in each level is accumulated respectively to produce accumulated values.

If the A/D converted value Vd is $1.16\ V \leq Vd < 1.64\ V$ (step T1), then a counter for an amplitude distribution level 1 is counted up (step T2). If $1.64\ V \leq Vd < 1.80\ V$ (step T3), then a counter for an amplitude distribution level 2 is counted up (step T4). If $1.80\ V \leq Vd < 2.0\ V$ (step T5), then a counter for an amplitude distribution level 3 is counted up (step T6). If the $2.0\ V \leq Vd < 2.5\ V$ (step T7), then a counter for an amplitude distribution level 4 is counted up (step T8). As a result, accumulated values for judging a non-modulated signal are obtained.

Figure 11:
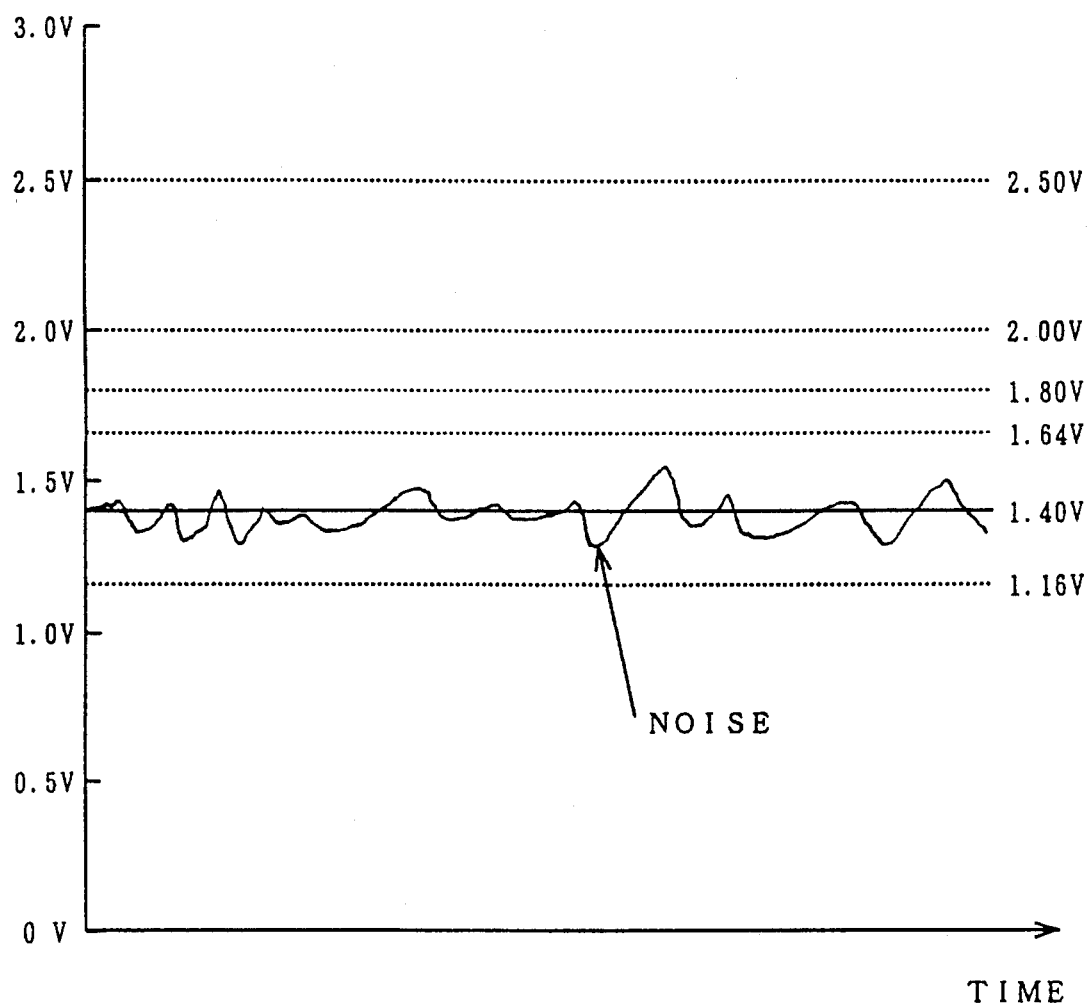
FIG. 11 shows a waveform of a non-modulated signal having a noise.

In FIG. 11, there is shown one example of the wave form of a non-modulated signal, a offset voltage thereof is 1.40 V. A noise is interposed to the non-modulated signal as shown in Fig. 11. An S/N (signal/noise) ratio of the received signal in the receiver is essential for discriminating a non-modulated signal from an audio signal. When the S/N ratio is lower, it is impossible due to a noise to distinguish a non-modulated signal from an audio signal. Therefore, the voltage range of 1.16 V–1.64 V in the level 1 should be selected considering the amplitude of a noise.

Figure 12A:
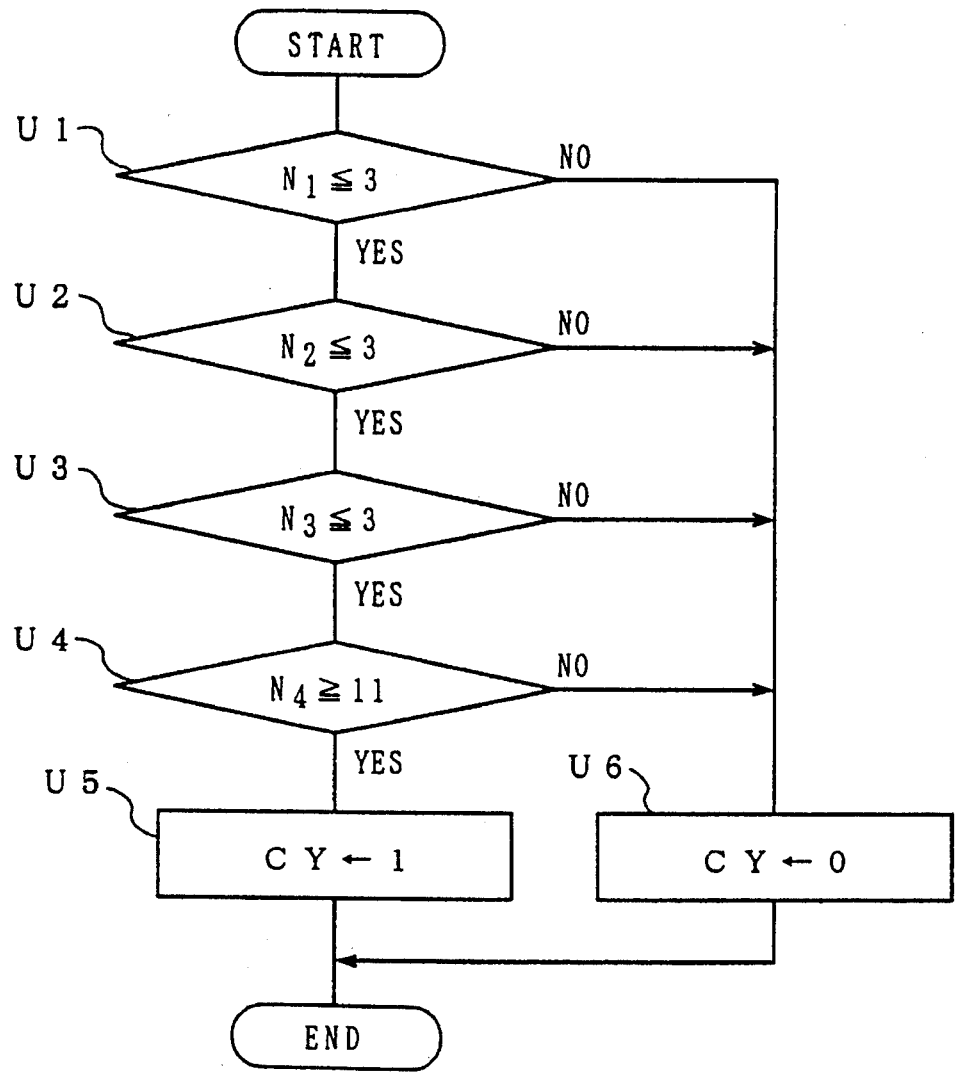
FIG. 12A is a detailed flow chart of the step Q7 in FIG. 6.
Figure 12B:
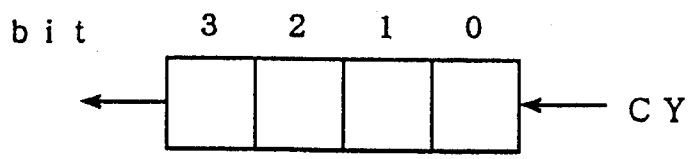
FIG. 12B shows a 4-bits storing area.

Referring now to FIGS. 12A and 12B, the process operation of the step Q7 in FIG. 6 will be described in more detail. The step Q7 is, as described before, the process for detecting an amplitude distribution pattern of the part of the AF signal corresponding to the time duration in which 50 samplings are carried out, using final accumulated values in respective four levels for judging a digital signal. In the steps U1, U2, U3 and U4, the following conditions for a digital signal are in turns judged.

$N_1 \leq 3$ $N_2 \leq 3$ $N_3 \leq 3$ $N_4 \geq 11$ wherein $N_1$, $N_2$, $N_3$ and $N_4$ are respectively the final accumulated values in the levels 1, 2, 3 and 4 during one cycle of 50 samplings.

Figure 13:
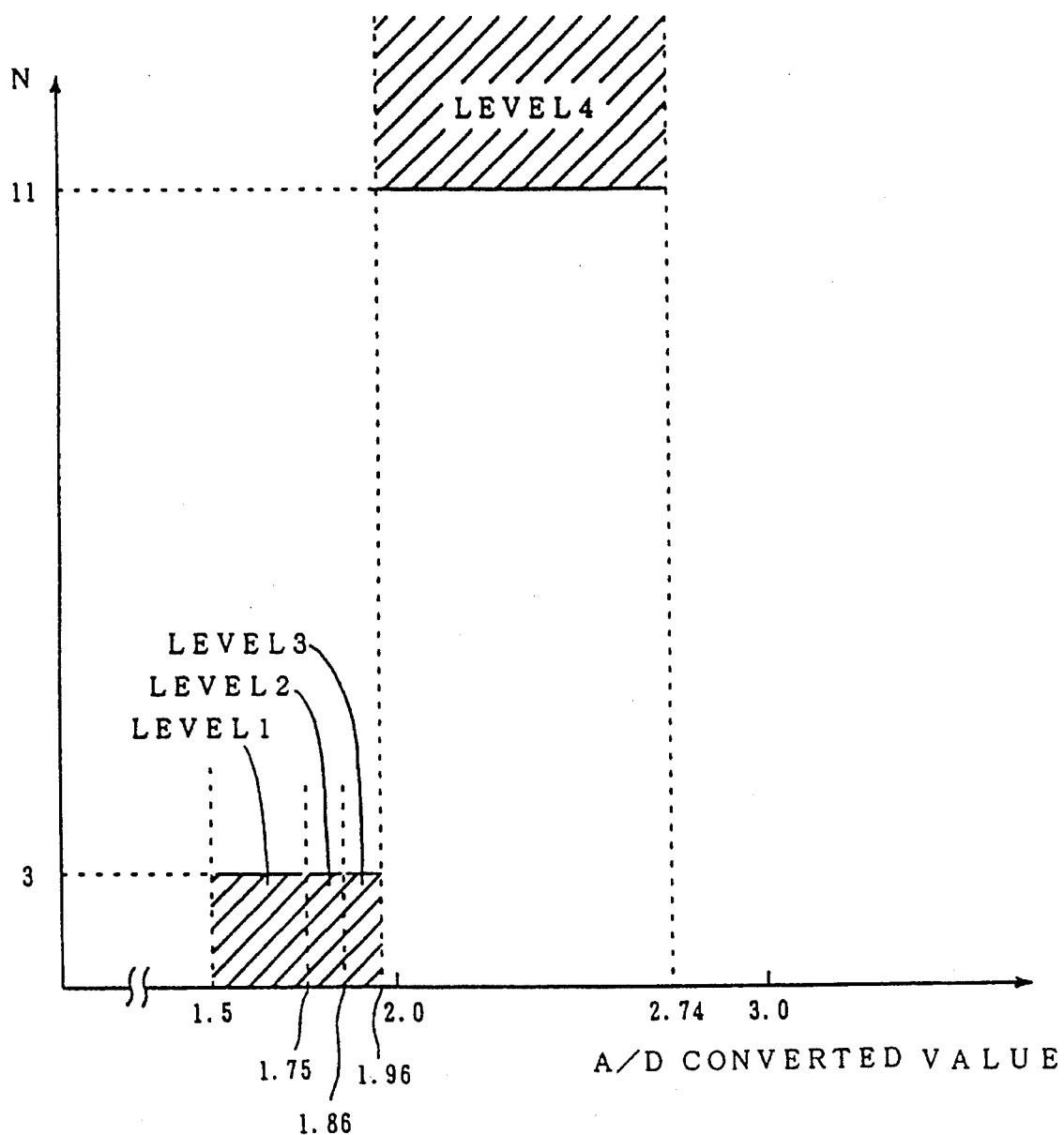
FIG. 13 is a graph of judging conditions for a digital signal.

These judging conditions are shown in the graph of FIG. 13 in which an abscissa designates the A/D converted value and an ordinate shows the final accumulated value N. The cross-hatched areas in FIG. 13 are those where the conditions are satisfied.

If all the judging conditions are satisfied with respect to the accumulated values $N_1, N_2, N_3, N_4$, then the corresponding part of the AF signal is judged as a digital signal. As a result, "1" is stored in the 4-bits judged result storing area (step U5). If any one of the judging conditions is not satisfied, then the corresponding part of the AF signal is not judged as a digital signal, without judging other conditions hereinafter. As a result, "0" is stored in the storing area (step U6). Assuming that respective bit positions in the 4-bits storing area are 0, 1, 2 and 4 as shown in FIG. 12B, "1" and "0" are input from the bit position 0 and shifted consecutively in a left direction in the figure.

Figure 14:
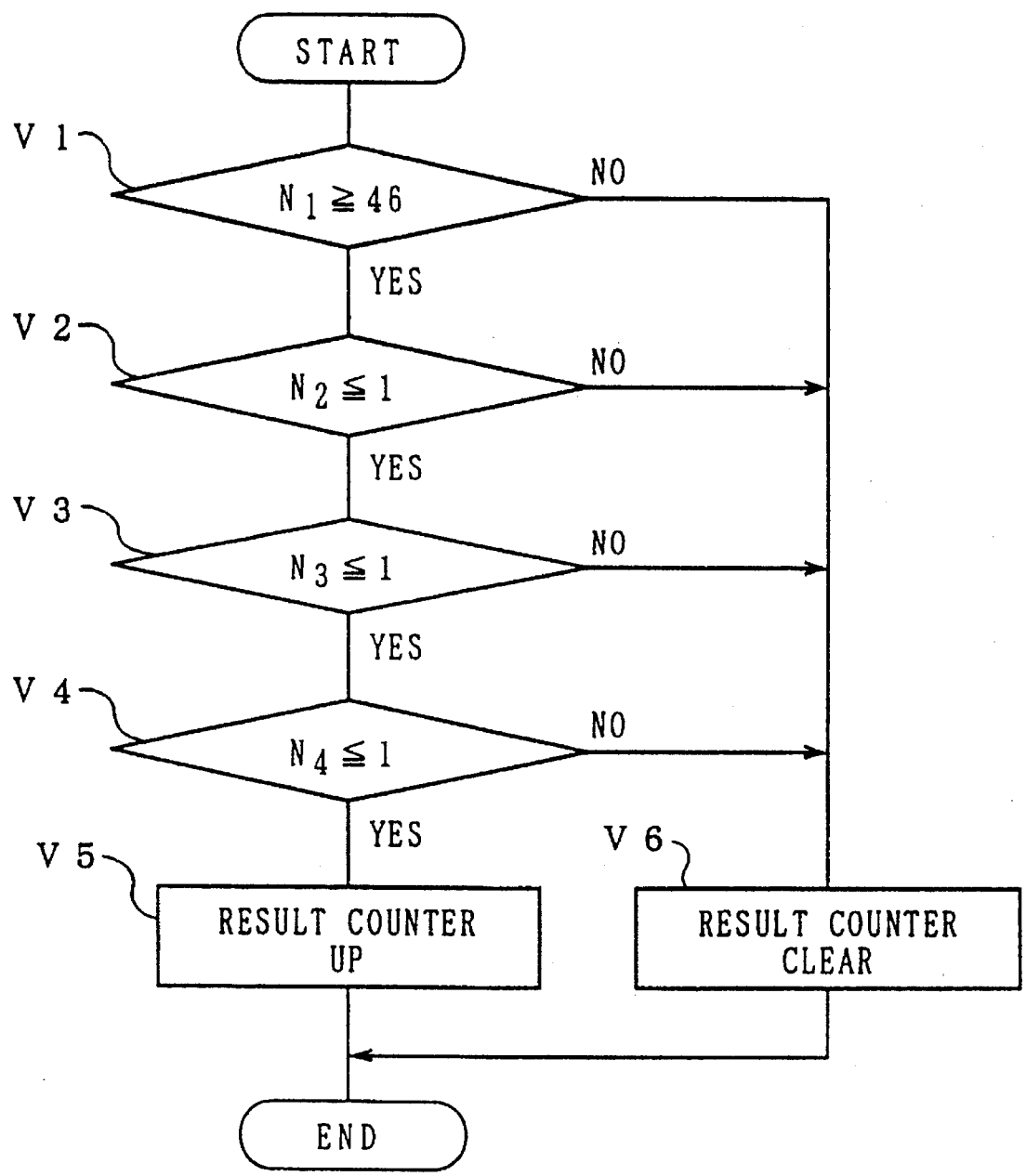
FIG. 14 is a detailed flow chart of the step Q8 in FIG. 6.

FIG. 14 shows a detailed flow chart of the step Q8 in Fig. 6. The step Q8 is, as described before, the process for detecting an amplitude distribution pattern of the part of the AF signal corresponding to the time duration in which 50 sampling are carried out, using final accumulated values in respective four levels for judging a non-modulated signal. In the steps V1, V2, V3 and V4, the following conditions for a non-modulated signal are in turns judged.

$N_1 \geq 46$
$N_2 \leq 1$
$N_3 \leq 1$
$N_4 \geq 1$ wherein $N_1$, $N_2$, $N_3$ and $N_4$ are respectively the final accumulated values in the levels 1, 2, 3 and 4 during one cycle of 50 samplings.

Figure 15:
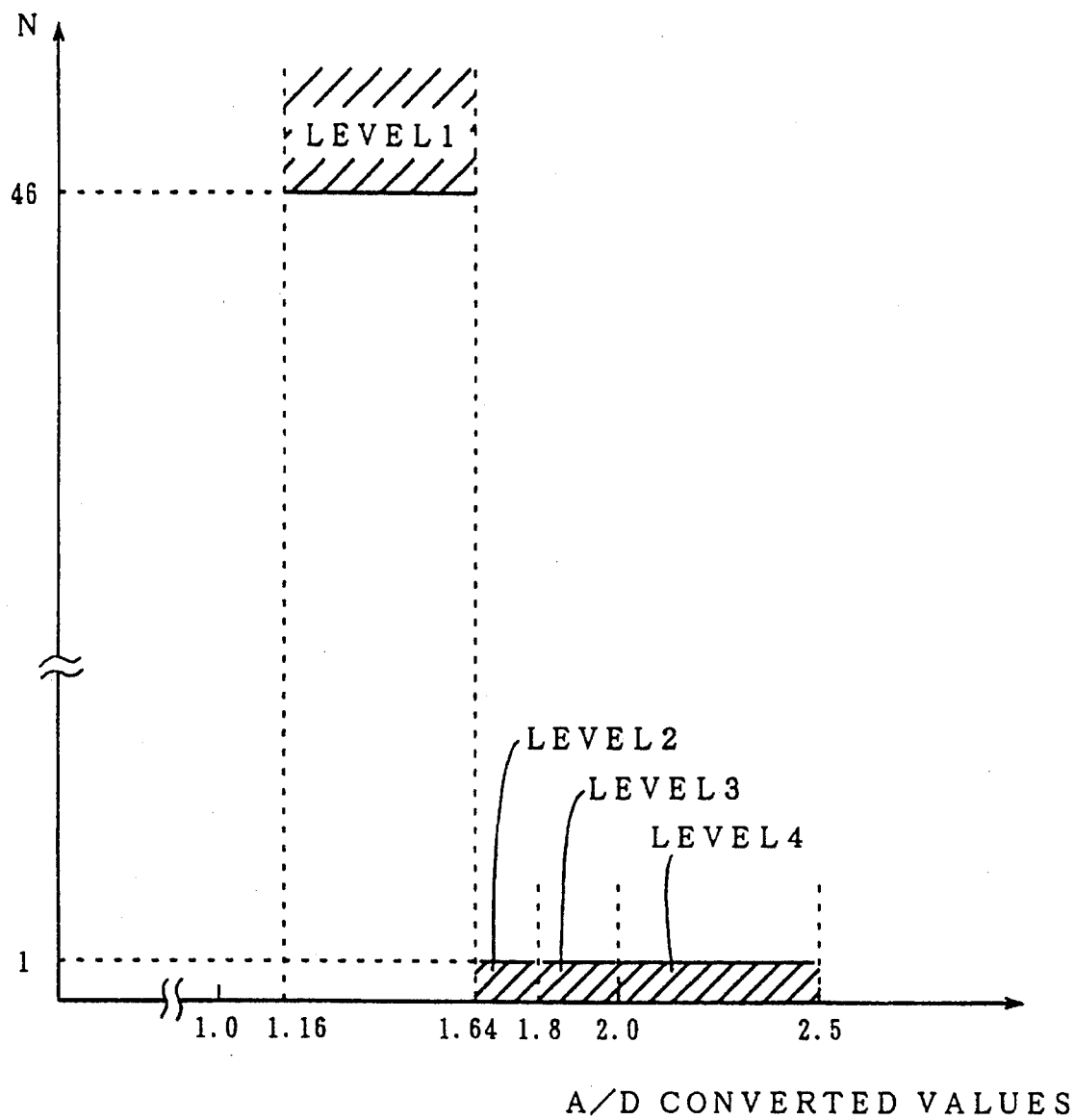
FIG. 15 is a graph of judging conditions for a non-modulated signal.

The condition for $N_1$ is strictly selected in such a manner that it is equal to or more than 46. This is to prevent the AF signal from erroneously being judged as a non-modulated signal even when the conversation in an audio signal is interrupted or the modulation factor in an audio signal is low. These judging conditions are shown in the graph of FIG. 15. An abscissa designates the A/D converted value and an ordinate shows the accumulated value N. The crosshatched areas in FIG. 15 are those where the conditions are satisfied.

If all the judging conditions are satisfied with respect to the accumulated values $N_1, N_2, N_3, N_4$, then the corresponding part of the AF signal is judged as a non-modulated signal, and the judged result counter is counted up (step V5). If any one of the judging conditions is not satisfied, then the judged result counter is cleared (step V6), without judging the conditions hereinafter.

Figure 16:
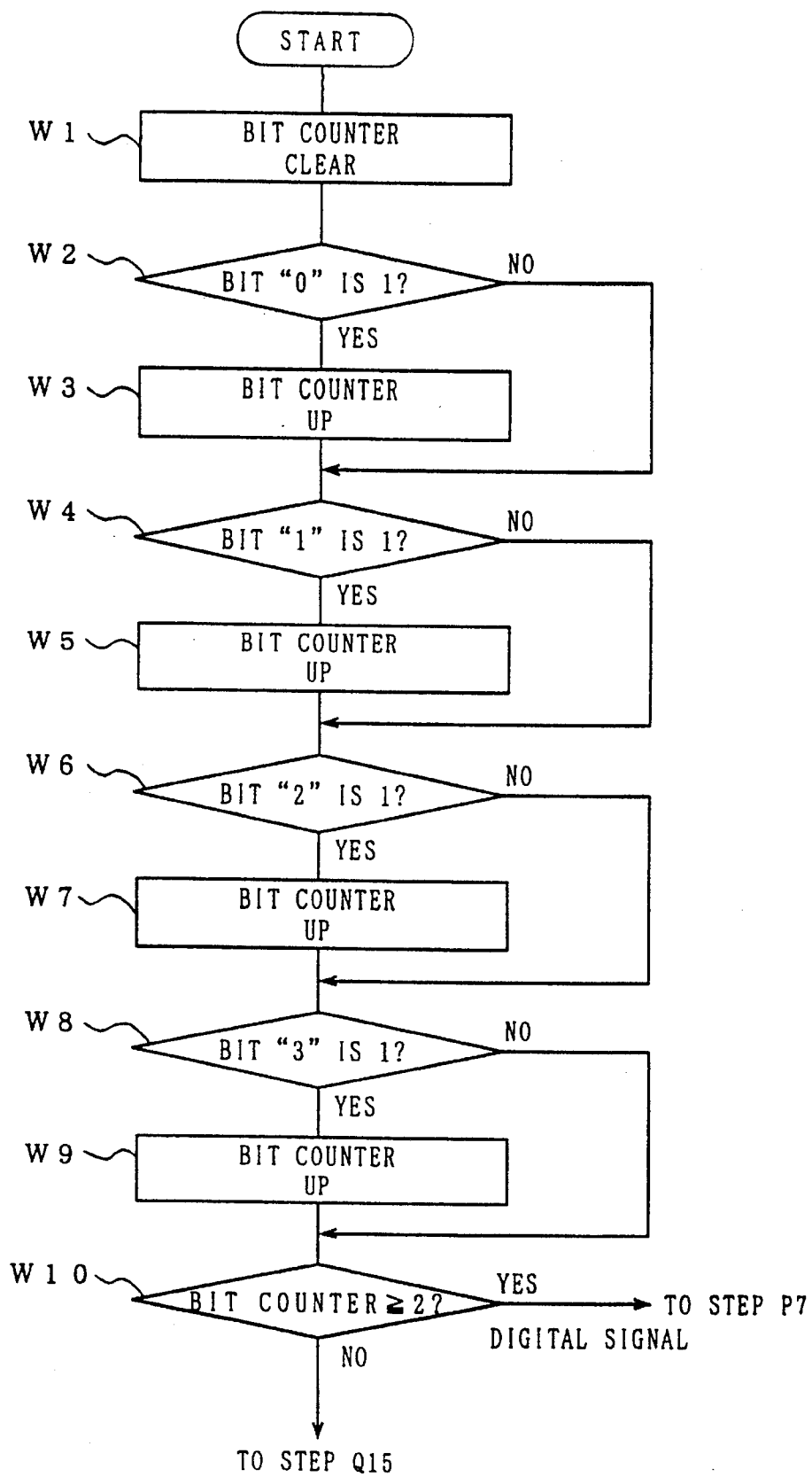
FIG. 16 is a detailed flow chart of the step Q14 in FIG. 6.

FIG. 16 shows a detailed flow chart of the step Q14 in Fig. 6. The step Q14 is, as described before, the process for discriminating finally whether or not the received signal is a digital signal, wherein the received signal is discriminated as a digital signal when the parts of AF signal on two or more cycles in last consecutive four cycles are digital signals. In the step Q14, firstly, a bit counter is cleared (step W1). Secondly, it is judged whether or not "1" or "0" is stored in respective bit positions of the 4-bits storing area in FIG. 12B (steps W2, W4, W6, W8). If "1" is stored, then the bit counter is counted up (steps W3, W5, W7, W9). Finally, if the counted value of the bit counter is equal to or more than 2, then the received signal is discriminated as a digital signal (step W10).

The step Q15 is the process for discriminating finally whether or not the received signal is a non-modulated signal, wherein the received signal is discriminated as a non-modulated signal when the parts of the AF signals on all four last consecutive cycles are non-modulated signals. Therefore, in this step Q15, if the counted value of the judged counter is 4, then the received signal is discriminated as a non-modulated signal.

As described above, it is judged in the microprocessor 14 whether the part of the AF signal on each of four cycles, one cycle including 50 samplings, is a non-modulated signal or a digital signal. If the parts of the AF signal on all four cycles are non-modulated signals, then the received signal is discriminated as an non-modulated signal, while if the parts of the AF signal on two or more cycles are digital signals, then the received signal is discriminated as a digital signal.

When the received signal is discriminated as a non-modulated signal or a digital signal, these undesired signals are skipped in the scanning operation, and the scanning is restarted. In accordance with the scanning receiver of this embodiment, therefore, a high speed scanning may be realized.

Figure 17A:
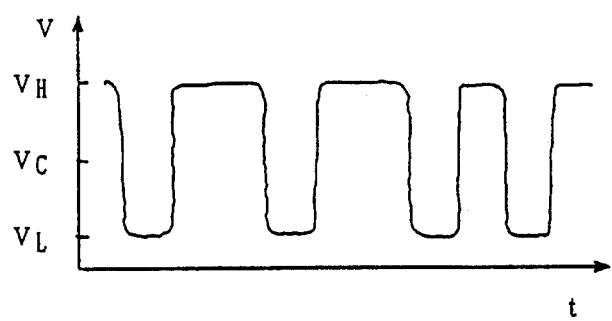
FIGS. 17A and 17B show digital signal waveforms.
Figure 17C:
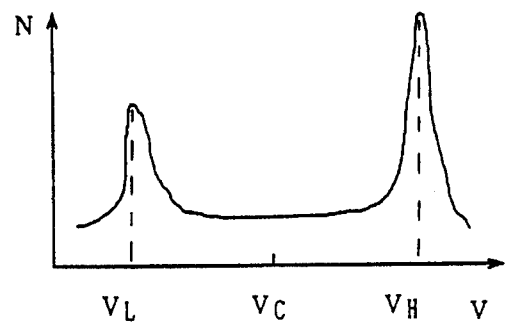
FIG. 17C is a graphic representation of an amplitude distribution of the digital signal shown in FIG. 17A.
Figure 17B:
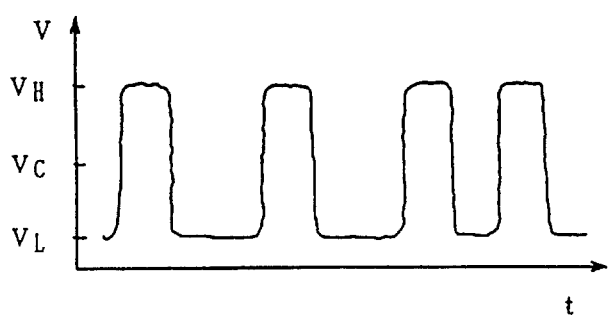
Figure 17D:
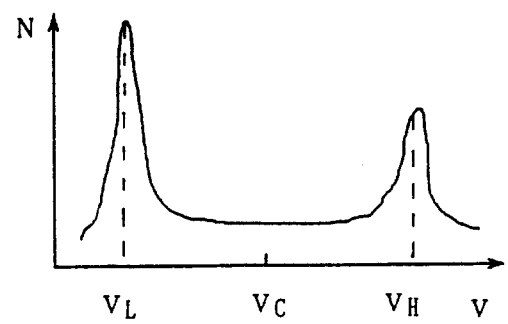
FIG. 17D is a graphic representation of an amplitude distribution of the digital signal shown in FIG. 17B.

In the aforementioned embodiment, it is assumed that a digital signal received by the scanning receiver has a pulse-shaped wave whose duty factor is about 0.5. However, the scanning receiver may receive a digital signal having a duty factor other than about 0.5. FIG. 17A shows a digital signal having a duty factor more than 0.5, while FIG. 17B shows a digital signal having a duty ratio less than 0.5. The amplitude distribution patterns thereof are shown in FIGS. 17C and 17D respectively. With respect to the signal waveforms, an abscissa indicates time lapse (t) and an ordinate shows an amplitude value in voltage (V). With regard to the amplitude distribution pattern, an abscissa represents an amplitude value in voltage (V) and an ordinate shows a distribution (N).

In case of the digital signal waveform in FIG. 17A, the first peak corresponding to the maximum amplitude vale $V_H$ is higher than the second peak corresponding to the minimum amplitude value $V_L$ as shown in FIG. 17C. Also, in case of the digital signal waveform in FIG. 17B, the first peak corresponding to the maximum amplitude value $V_H$ is lower than the second peak corresponding to the minimum amplitude value $V_L$ as shown in Fig. 17D. That is, the maximum peak of the amplitude distribution pattern of a digital signal does appear at the amplitude value $V_H$ or $V_L$ based on its duty factor. Therefore, it is difficult to judge successfully both amplitude distribution patterns shown in FIGS. 17C and 17D in accordance with the judging conditions decided for amplitude values higher or lower than the offset value $V_c$ of a digital signal.

Figure 18:
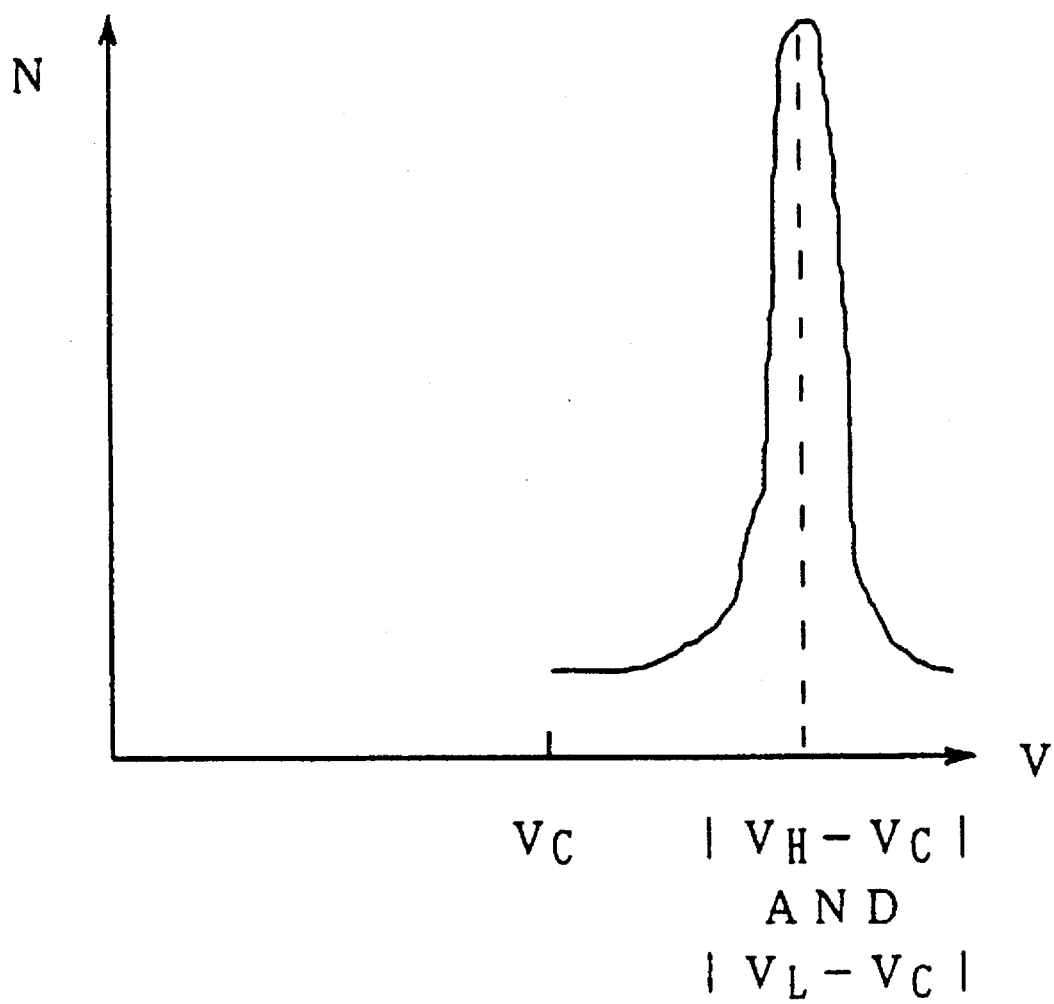
FIG. 18 is a graphic representation of an amplitude distribution pattern for absolute amplitude values.

In order to discriminate certainly a digital signal in spite of its duty factor, the present invention employs the following methods. That is, absolute amplitude values relative to the offset voltage $V_c$ of a digital signal are A/D converted, and the resulting A/D converted values are used to generate amplitude distribution data. FIG. 18 shows an amplitude distribution pattern for the absolute amplitude values $|V_{H-Vc}|$ and $|V_{L-Vc}|$. As apparent from FIG. 18, there is only one peak in the amplitude distribution pattern. Using this characteristic, a certain discrimination for a digital signal may be possible.

The second embodiment will now be described, wherein a digital signal is successfully discriminated in spite of its duty factor. The process operation of this embodiment is substantially the same as that of the aforementioned first embodiment, so only different operation from that in the first embodiment will be explained hereinafter.

Figure 19:
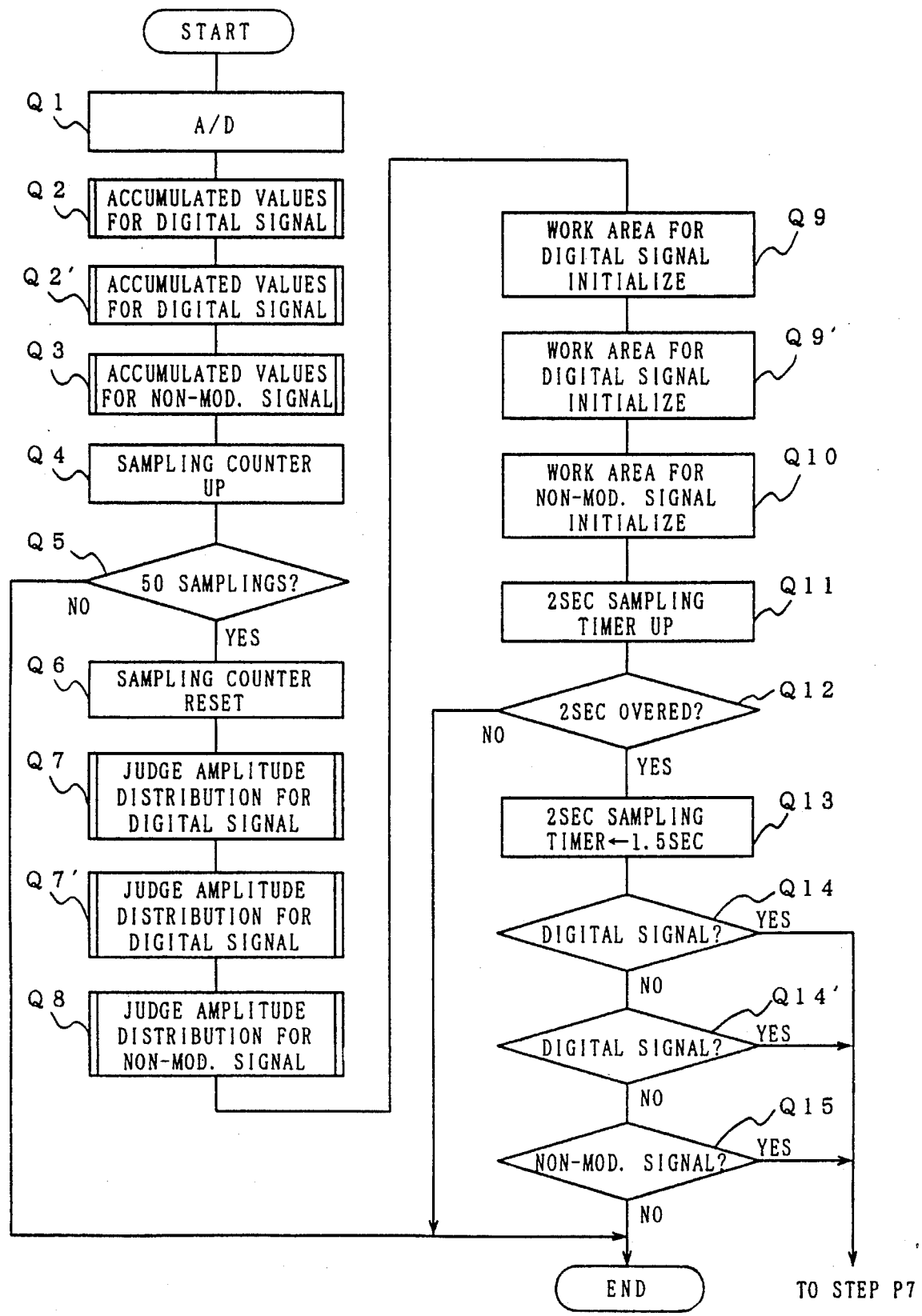
FIG. 19 is a detailed flow chart of the step P4'.

FIG. 19 shows a flow chart of the discrimination step P4 in FIG. 5, which corresponds to the flow chart in FIG. 6. Steps Q2', Q7', Q9' and Q14' are further added to the flow chart in FIG. 6.

Figure 20:
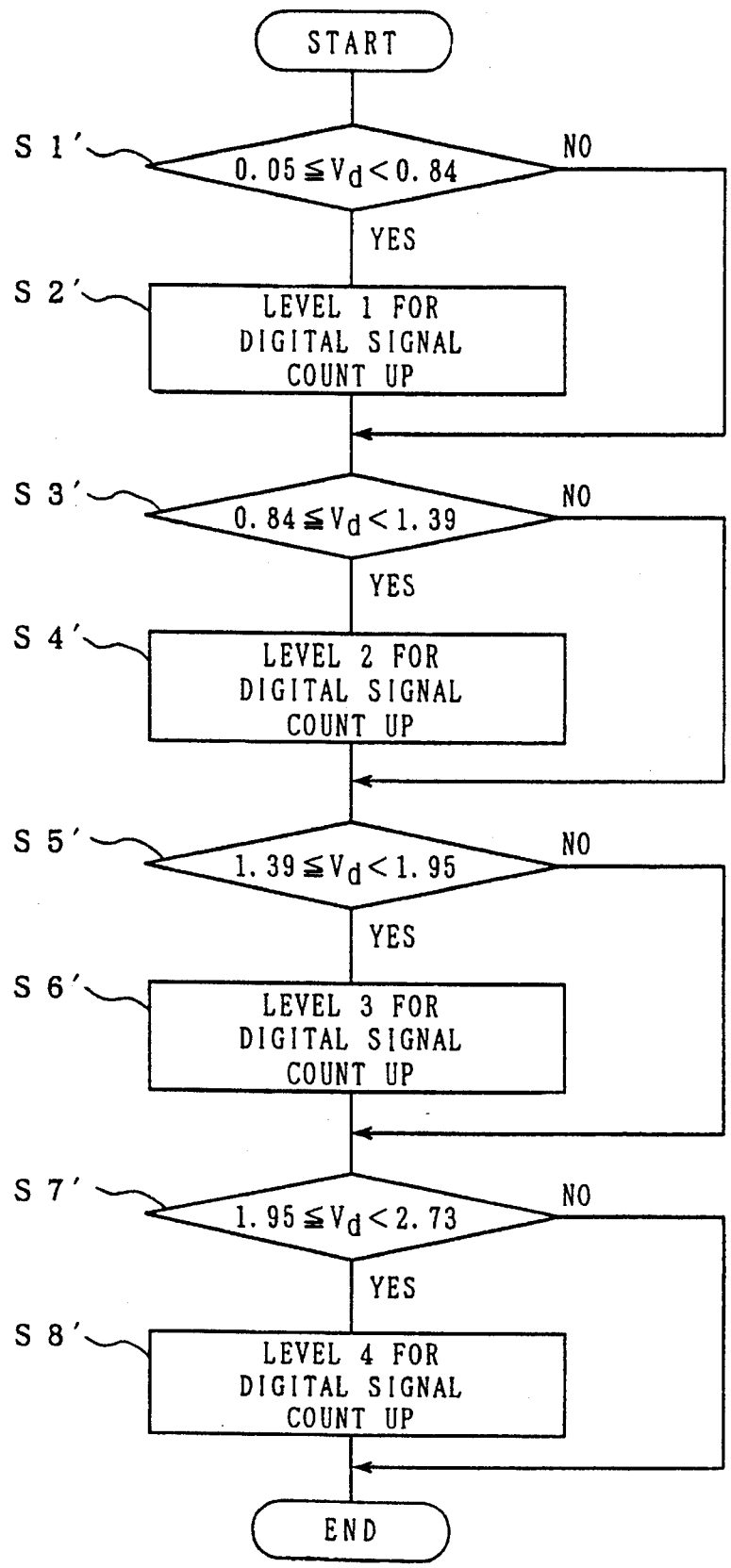
FIG. 20 is a detailed flow chart of the step Q2'.

The step Q2' is a process for producing accumulated values in consecutive four amplitude distribution levels for a digital signal. FIG. 20 shows the process operation in the step Q2'. Assuming that an A/D converted value is Vd, if $0.05 \text{ V} \leq Vd < 0.84 \text{ V}$ (step S1'), then a counter for an amplitude distribution level 1 is counted up (step 2'). If $0.84 \text{ V} \leq Vd < 1.39 \text{ V}$ (step S3'), then a counter for an amplitude distribution level 2 is counted up (step S4'). If $1.39 \text{ V} \leq Vd < 1.95 \text{ V}$ (step S5'), then a counter for an amplitude distribution level 3 is counted up (step S6'). If $1.95 \text{ V} \leq Vd < 2.73 \text{ V}$ (step S7'), then a counter for an amplitude distribution level 4 is counted up (step S8').

Figure 21:
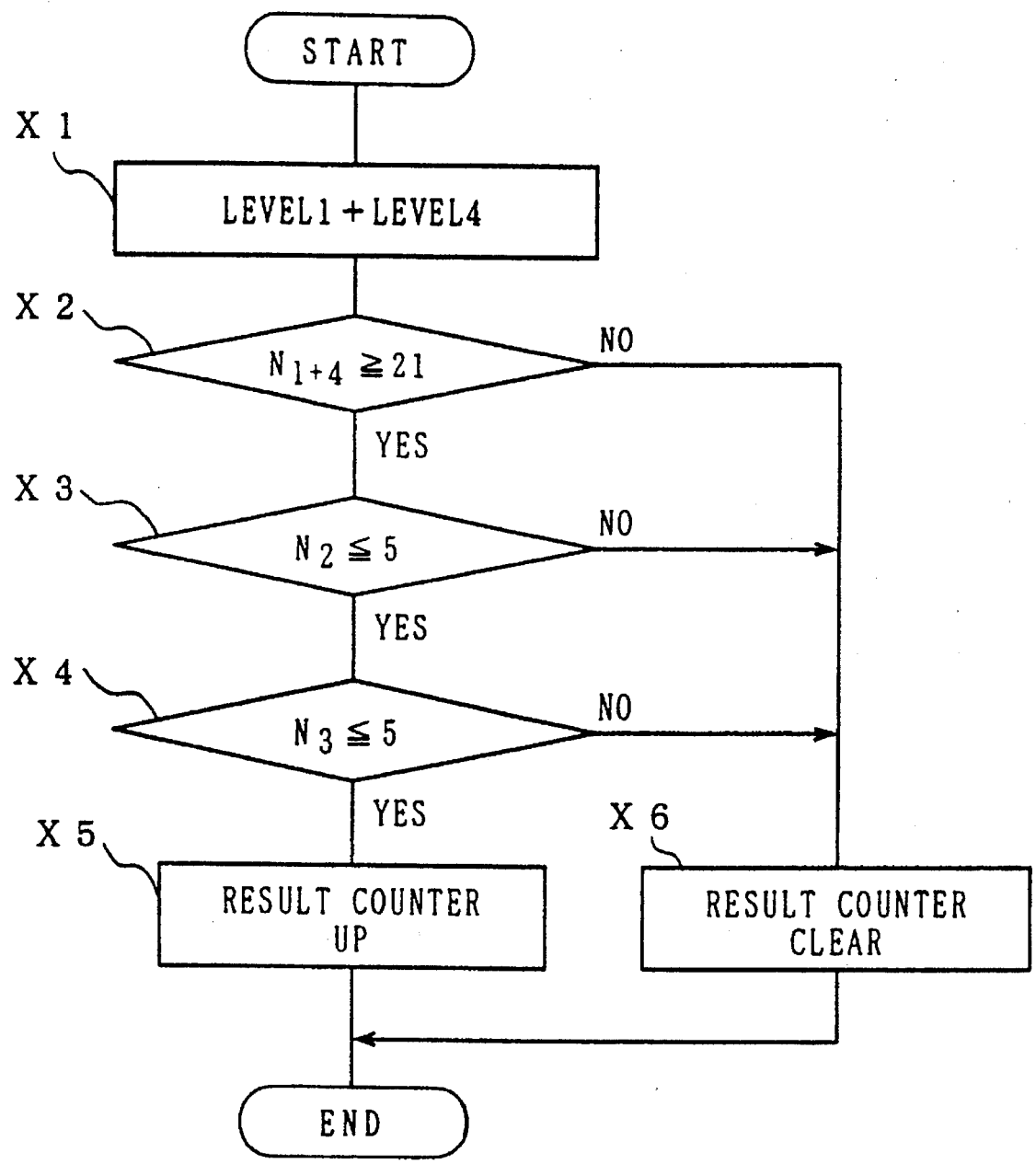
FIG. 21 is a detailed flow chart of the step Q7'.

The step Q7' is a process for judging whether or not the part of the AF signal has a digital amplitude distribution pattern. A detailed flow chart of the step Q7' is shown in Fig. 21. The accumulated value in the level 1 and the accumulated value in the level 4 are added (step X1) to produce accumulated value for absolute amplitude values $|V_H-V_c|$ and $|V_L-V_c|$ of a digital signal. In the steps X2, X3 and X4, the following conditions are in turns judged.

$N_{1+4} \geq 21$ $N_2 \leq 5$ $N_3 \leq 5$ wherein $N_{1+4}$ is the added value of the accumulated values in the levels 1 and 4, $N_2$ is the accumulated value in the level 2, and $N_3$ is the accumulated value in the level 3.

If all the judging conditions are satisfied, then the corresponding part of the AF signal is judged as a digital signal, and a judged result counter is counted up (step X5). If any one of judging conditions is not satisfied, the judged result counter is cleared (step X6).

Returning to FIG. 19, the work area used for storing accumulated values is cleared in the step Q9'. In the step Q14' following the step Q14, the process for discriminating whether or not the received signal is a digital signal is carried out using the judged results obtained by the step Q7'. If the corresponding parts of the AF signal on all four last consecutive cycles are digital signals, the received signal is finally discriminated as a digital signal. Therefore, even if the received signal is not discriminated as a digital signal due to the duty factor in the step Q14, the received signal may be certainly discriminated as a digital signal in the step Q14'.

Figure 22:
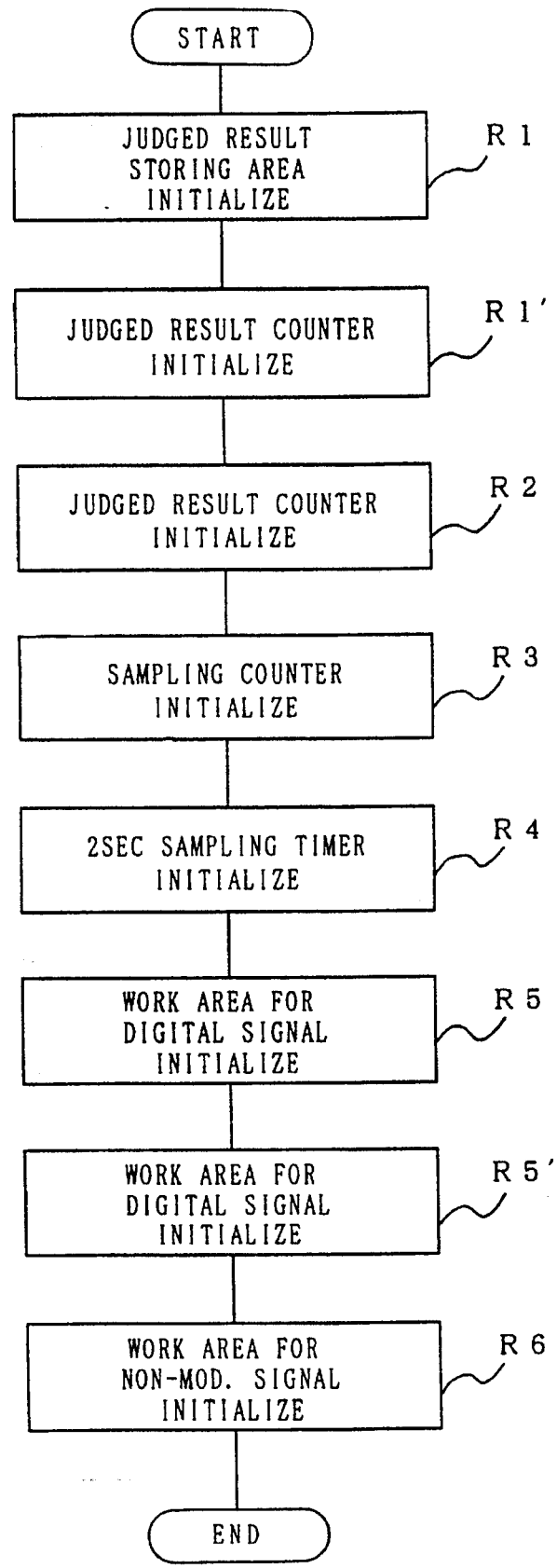
FIG. 22 is a detailed flow chart of initializing step for discrimination work area.

In this embodiment, the step P7 in FIG. 5 (clear for a discrimination work area) is replaced by the steps shown in Fig. 22. In the flow chart in FIG. 22, the following steps are added to the flow chart in FIG. 7, i.e., initializing the judged result counter described in the step Q7' (step R1'), and initializing work area for judging a digital signal described in the step Q7' (step RS').

In accordance with this second embodiment, a digital signal may be certainly discriminated so that a digital signal may be skipped completely in the scanning operation in spite of the duty factor thereof.

Figure 23A:
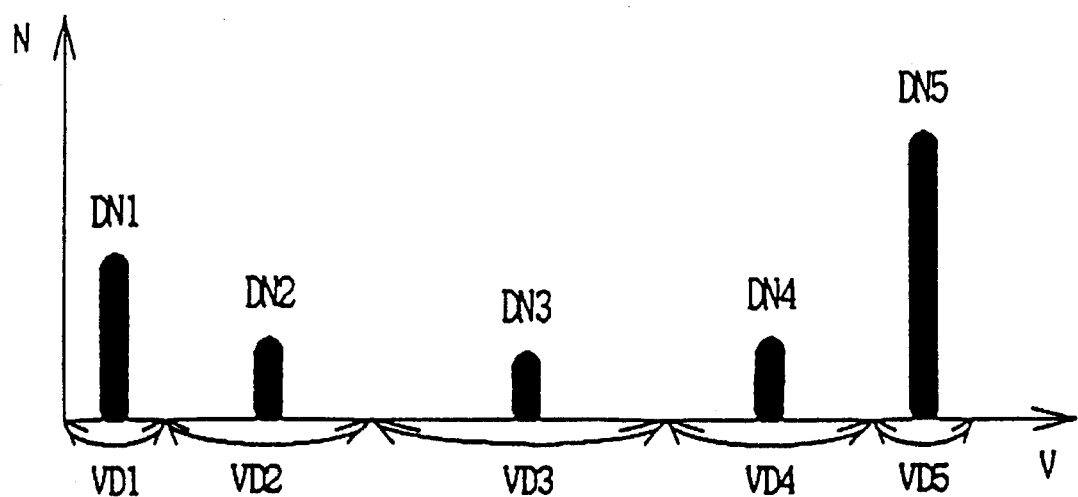
FIG. 23A shows accumulated values in five levels.
Figure 23B:
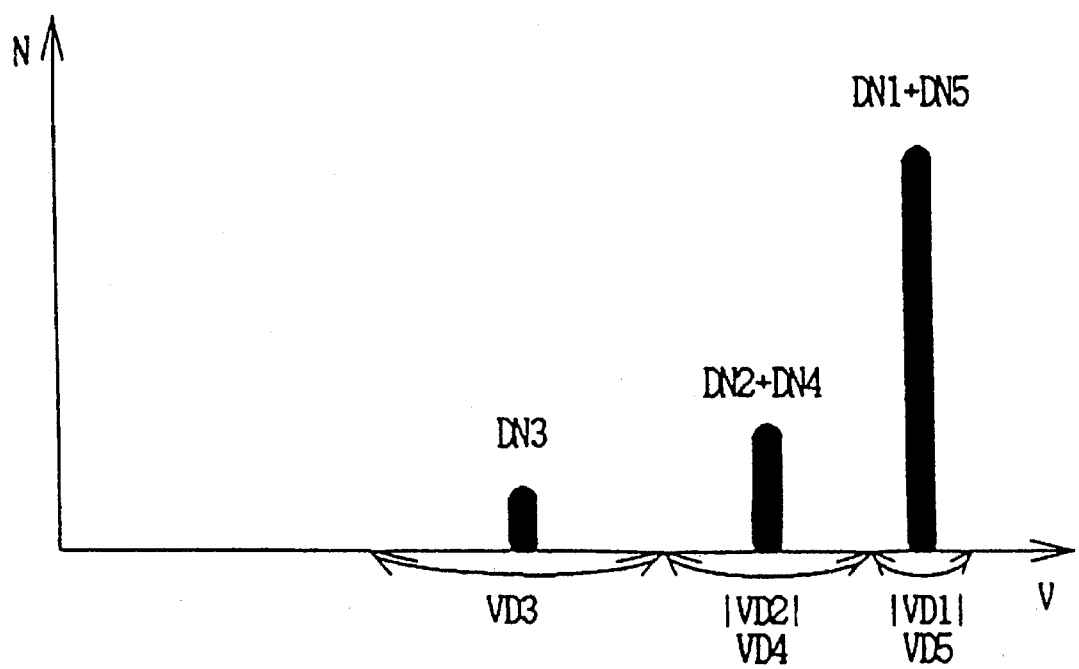
FIG. 23B shows added accumulated values.

Also, in the second embodiment, the accumulated values are produced in four levels and the accumulated values in the level 1 and level 4 are added to generate the accumulated value for absolute amplitude values of a digital signal. In case of five levels, for instance, as shown in FIG. 23A wherein VD1, VD2, VD3, VD4 and VD5 are the voltage ranges in the five levels and DN1, DN2, DN3, DN4 and DN5 are the accumulated values in respective levels. DN2 and DN4, and DN1+DN5 are added respectively as shown in FIG. 23B to produce the accumulated value for absolute amplitude values of a digital signal. The judging condition is applied to the accumulated values DN3, DN2+DN4, and DN1+DN5.

While the invention has been described in terms of its preferred embodiments, those skilled in the art will realize that the invention can be practiced with modification within the spirit and scope of the appended claims.

The invention claimed is:

1. A scanning receiver for receiving a signal by scanning the frequency of a received signal, comprising:

a sampling and A/D (analog to digital) converting circuit which samples and converts an audio frequency (AF) signal detected by the scanning receiver to produce A/D converted values;

first forming apparatus which forms, from the A/D-converted values, a first amplitude distribution of a predetermined number of samples representing evey one cycle, the first amplitude distribution consisting of accumulated values of the number of the A/D converted values included in each of a plurality of consecutive amplitude distribution levels for judging a non-modulated signal, each level having a predetermined voltage range;

second fonning apparatus which forms, from the A/D-converted values, a second amplitude distribution of the samples representing the every one cycle, the second amplitude distribution consisting of accumulated values of the number of the A/D converted values included in each of a plurality of consecutive amplitude distribution levels for judging a digital signal, each level having a further predetermined voltage range;

first judging apparatus which judges whether or not the part of the AF signal corresponding to one cycle of samples is a non-modulated signal based on the first amplitude distribution, and generates a first judged result for the every one cycle of samples;

second judging apparatus which judges whether or not the part of the AF signal corresponding to one cycle of samples is a digital signal based on the second amplitude distribution, and generates a second judged result for the every one cycle of samples;

first discriminating apparatus which discriminates whether or not the received signal is a non-modulated signal based on first amplitude distribution data consisting of the first judged results for the predetermined plurality of cycles of samples:

second discriminating apparatus which discriminates whether or not the received signal is a digital signal based on second amplitude distribution data consisting of the second judged results for the predetermined plurality of the cycles of samples; and signaling apparatus which indicates that non-modulated signals and/or digital signals are to be skipped in a scanning operation of the receiver, when the received signal is discriminated as a non-modulated signal and/or a digital signal, wherein each voltage range for the amplitude distribution levels for judging a digital signal is selected so as to be included in the region higher or lower than the offset value of the digital signal.

2. A scanning receiver for receiving a signal by scanning the frequency of a received signal, comprising:

a sampling and A/D (analog to digital) converting circuit for sampling and converting an audio frequency (AF) signal detected by the scanning receiver to produce A/D convened values;

first forming apparatus which forms, from the A/D-converted values, a first amplitude distribution representing every one cycle of predetermined number of samples, the first amplitude distribution consisting of accumulated values of the number of the A/D converted values included in each of a plurality of consecutive amplitude distribution levels for judging a non-modulated signal, each level having a predetermined voltage range;

second forming apparatus which forms, from the A/D-converted values, a second amplitude distribution representing said every one cycle, the second amplitude distribution consisting of accumulated values of the number of the A/D converted values included in each of a plurality of consecutive amplitude distribution levels for judging a digital signal each level having a predetermined voltage range;

first judging apparatus which judges whether or not the part of the AF signal corresponding to one cycle of samples is a non-modulated signal based on the first amplitude distribution, and generating a first judged result for every one cycle of samples;

second judging apparatus which judges whether or not the part of the AF signal corresponding to one cycle of samples is a digital signal based on the second amplitude distribution, and generating second judged result every one cycle of samples;

first discriminating apparatus which discriminates whether or not the received signal is a non-modulated signal based on first amplitude distribution data consisting of the first judged results for a predetermined plurality of cycles of samples;

second discriminating apparatus which discriminates whether or not the received signal is a digital signal based on the second amplitude distribution data consisting of the second judged results for the predetermined plurality of the cycles; and signaling apparatus which indicates that non-modulated signals and/or digital signals are to be skipped in a scanning operation of the receiver, when the received signal is discriminated as a non-modulated signal and/or a digital signal, wherein each voltage range for the amplitude distribution levels for judging a digital signal is selected so as to be included in both regions higher and lower than the offset value of the digital signal.

3. A scanning receiver as claimed in claim 1 or 2 wherein:

the received signal is discriminated as a non-modulated signal when all the first judged results in the first amplitude distribution data show non-modulated signals; and the received signal is discriminated as a digital signal when at least one of the second judged results in the second amplitude distribution data show digital signals.

4. A scanning receiver for receiving a signal by scanning the frequency of a received signal, comprising:

a sampling and A/D (analog to digital) converting circuit which samples and converts an audio frequency (AF) signal detected by the scanning receiver to produce A/D converted values;

first forming apparatus which forms, from the A/D-converted values, a first amplitude distribution representing every one cycle of predetermined number of samples, the first amplitude distribution consisting of first accumulated values of the number of the A/D converted values included in each of a plurality of first consecutive amplitude distribution levels for judging a non-modulated signal, each level having a predetermined voltage range;

second forming apparatus which forms, from the A/D-converted values, a second amplitude distribution representing said every one cycle, the second amplitude distribution consisting of second accumulated values of the number of the A/D converted values included in each of a plurality of second consecutive amplitude distribution levels for judging a digital signal, each level having a predetermined voltage range;

third forming apparatus which forms, from the A/D-converted values, a third amplitude distribution representing said every one cycle, the third amplitude distribution consisting of third accumulated values of the number of the A/D converted values included in each of a plurality of third consecutive amplitude distribution levels for judging a digital signal, each level having a predetermined voltage range;

wherein at least one set of the third accumulated values are added to produce accumulated value for absolute amplitude values of a digital signal, when it is judged whether or not the part of the AF signal corresponding to one cycle of sampling is a digital signal based on the third amplitude distribution;

wherein each voltage range for the second amplitude distribution levels for judging a digital signal is selected so as to be included in the region higher or lower than the offset value of the digital signal; and wherein each voltage range for the third amplitude distribution levels for judging a digital signal is selected so as to be included in both regions higher and lower than the offset value of the digital signal.

5. A scanning receiver as claimed in claim 4, wherein:

the received signal is discriminated as a non-modulated signal when all the first judged results in the first amplitude distribution data show non-modulated signals; and the received signal is discriminated as a digital signal when at least one of the second judged results in the second amplitude distribution data show digital signals, and/or at least one of the third judged results in the third amplitude distribution data show digital signals.

* * * * *

UNITED STATES PATENT AND TRADE MARK OFFICE
CERTIFICATE OF CORRECTION

PATENT NO. : 5,577,076
DATED : November 19, 1996
INVENTOR(S) : K. Sato et al.

It is certified that error appears in the above-identified patent and that said Letters Patent is hereby corrected as shown below:

On the title page, Item [56] the Tomohiro Patent number should read --5,220,682

Column 3, line 50, change "a FSK" to --an FSK--.

Column 6, line 15, delete the word "counts" and insert therefor --counted--.

Column 7, line 46 change "a FSK" to --an FSK--.

Column 10, line 3 change "other-than" to --other than--.

Column 12, line 1, delete the word "fonning" and insert therefor --forming--.

Column 12, line 43, delete the word "convened" and insert therfor --converted--.

Column 12, line 58, insert a --,-- between the words "signal" and "each".

Signed and Sealed this

Twentieth Day of May, 1997

Attest:

BRUCE LEHMAN

*Attesting Officer*                *Commissioner of Patents and Trademarks*